(12) United States Patent
Onuki

(10) Patent No.: US 9,467,139 B2
(45) Date of Patent: Oct. 11, 2016

(54) SEMICONDUCTOR DEVICE

(71) Applicant: Semiconductor Energy Laboratory Co., Ltd., Atsugi-shi, Kanagawa-ken (JP)

(72) Inventor: Tatsuya Onuki, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/641,708

(22) Filed: Mar. 9, 2015

(65) Prior Publication Data
US 2015/0263725 A1  Sep. 17, 2015

(30) Foreign Application Priority Data

Mar. 13, 2014  (JP) ................................ 2014-049605

(51) Int. Cl.
G11C 7/00 (2006.01)
H03K 17/687 (2006.01)
H03K 17/16 (2006.01)

(52) U.S. Cl.
CPC .......... H03K 17/687 (2013.01); H03K 17/161 (2013.01)

(58) Field of Classification Search
CPC ........ G11C 7/12; H03K 17/687; H03L 7/08; H03B 5/00
USPC ........... 327/108–112, 427, 434, 437; 365/63, 365/189.011, 149
See application file for complete search history.

(56) References Cited

U.S. PATENT DOCUMENTS

| | | | |
|---|---|---|---|
| 4,466,081 | A | 8/1984 | Masuoka |
| 5,731,856 | A | 3/1998 | Kim et al. |
| 5,744,864 | A | 4/1998 | Cillessen et al. |
| 6,127,702 | A | 10/2000 | Yamazaki et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Ishii.T et al., "A Poly-Silicon TFT With a Sub-5-nm Thick Channel for Low-Power Gain Cell Memory in Mobile Applications,", IEEE Transactions on Electron Devices, Nov. 1, 2004, vol. 51, No. 11, pp. 1805-1810.

(Continued)

Primary Examiner — Lincoln Donovan
Assistant Examiner — Thomas Skibinski
(74) Attorney, Agent, or Firm — Fish & Richardson P.C.

(57) ABSTRACT

A semiconductor device capable of reducing power consumption is provided. A writing potential is supplied to the cell 11 in which data rewriting is to be performed, whereby data is written. Meanwhile, in the cell 11 in which data rewriting is not to be performed, the data is transferred to the cell 12 and then the transferred data is rewritten to the cell 11. As a result, the data stored in the cell 11 in which data rewriting is not to be performed can be maintained without the reading and writing operation in a driver circuit. This results in a higher rewriting speed and lower power consumption in the driver circuit.

10 Claims, 20 Drawing Sheets

(56) References Cited

U.S. PATENT DOCUMENTS

| | | |
|---|---|---|
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,638,128 B1 | 1/2014 | Oo |
| 9,240,244 B2 | 1/2016 | Nagatsuka et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0047266 A1 | 3/2005 | Shionoiri et al. |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1* | 6/2006 | Den .............. G03G 5/08 257/79 |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0148171 A1 | 6/2010 | Hayashi et al. |
| 2012/0033488 A1* | 2/2012 | Nagatsuka ......... G11C 16/0433 365/149 |
| 2012/0063203 A1 | 3/2012 | Matsuzaki et al. |
| 2012/0257439 A1 | 10/2012 | Kurokawa |
| 2012/0287700 A1 | 11/2012 | Takemura |
| 2014/0286073 A1* | 9/2014 | Onuki ................ G11C 11/403 365/63 |
| 2015/0091629 A1* | 4/2015 | Ishizu ................ G11C 5/145 327/306 |
| 2015/0294710 A1* | 10/2015 | Onuki ................ G11C 7/1069 365/149 |
| 2016/0043715 A1* | 2/2016 | Kurokawa ........... H03K 17/687 365/189.011 |

FOREIGN PATENT DOCUMENTS

| | | |
|---|---|---|
| JP | 57-105889 A | 7/1982 |
| JP | 59-152725 A | 8/1984 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 04-255988 A | 9/1992 |
| JP | 05-128861 A | 5/1993 |
| JP | 05-251705 A | 9/1993 |
| JP | 07-065594 A | 3/1995 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-063548 A | 3/2005 |
| JP | 2012-256400 A | 12/2012 |
| WO | WO-2004/114391 | 12/2004 |

OTHER PUBLICATIONS

Kim.W et al., "An Experimental High-Density DRAM Cell with a Built-in Gain Stage,", IEEE Journal of Solid-State Circuits, Aug. 1, 1994, vol. 29, No. 8, pp. 978-981.

Shukuri.S et al., "A Complementary Gain Cell Technology for sub-1 V Supply DRAMs,", IEDM 92: Technical Digest of International Electron Devices Meetings, Dec. 13, 1992, pp. 1006-1008.

Shukuri.S et al., "A Semi-Static Complementary Gain Cell Technology for Sub-1 V Supply DRAM's,", IEEE Transactions on Electron Devices, Jun. 1, 1994, vol. 41, No. 6, pp. 926-931.

(56) References Cited

OTHER PUBLICATIONS

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1: Polarizer-Free Reflective LCD Combined With Ultra Low-Power Driving Technology", SID Digest '09 : SID International Symposium Digest of Technocal Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A(Physical Review. A), May 1, 1984, vol. 29, No. 5, pp. 2957-2959.

Dembo.H et al., "RFCPUS on Glass and Plastic Substrates Fabricated by TFT Transfer. Technology", IEDM 05: Technical Digest of International Electron Devices Meetings, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Sympoisum Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies In ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N. et al., "Spinel,YbFe2O4, and Yb2Fe3O7 Types of Structures for Compounds in The In2O3 and Sc2O3—A2O3—BO Systems [A; Fe, Ga, or Al; B: Mg, Mn, Fe, Ni, Cu,Or Zn] at Temperatures Over 1000° C.", Journal of Solid State Chemistry, 1985, vol. 60, pp. 382-384.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 13, pp. 911-916.

Kurokawa.Y et al., "UHF RFCPUS on Flexible and Glass Substrates for Secure RFID Systems"Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06: Proceedings of the 13th International Display Workshops, Dec. 7, 2006, pp. 663-666.

Lee.J et al., "World'S Largest (15-Inch) XGA AMLCD Panel Using IGZO Oxide TFT", SID Digest '08 : SID Intenational Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "Suftla Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

(56) References Cited

OTHER PUBLICATIONS

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 in. QVGA AMOLED Display Using In—Ga—Zn—Oxide TFTs With a Novel Passivation Layer", SID Digest '09: SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Letts. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08: SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTs", IDW '09: Proceedings of the 16th International Display Workshops, 21009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08: SID International Symposium Digest of Technical papers, May 20, 2008, vol. 39, pp. 633-636.

Takahashi.M et al., "Theoretical Analysis of IGZO Transparent Amorphous Oxide Semiconductor", IDW '08: Proceedings of the 15th International Display Workshops, Dec. 3, 2008, pp. 1637-1640.

Tsuda.K et al., "Ultra Low Power Consumption Technologies for Mobile TFT-LCDs ", IDW '02: Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Letts. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

FIG. 2
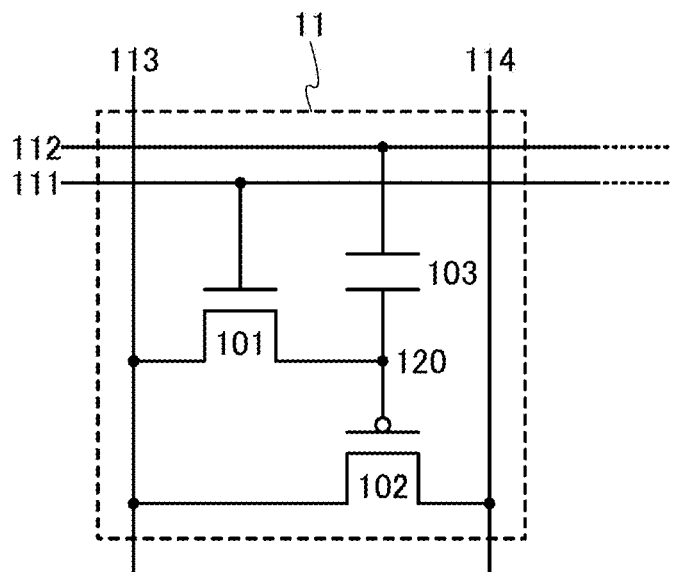
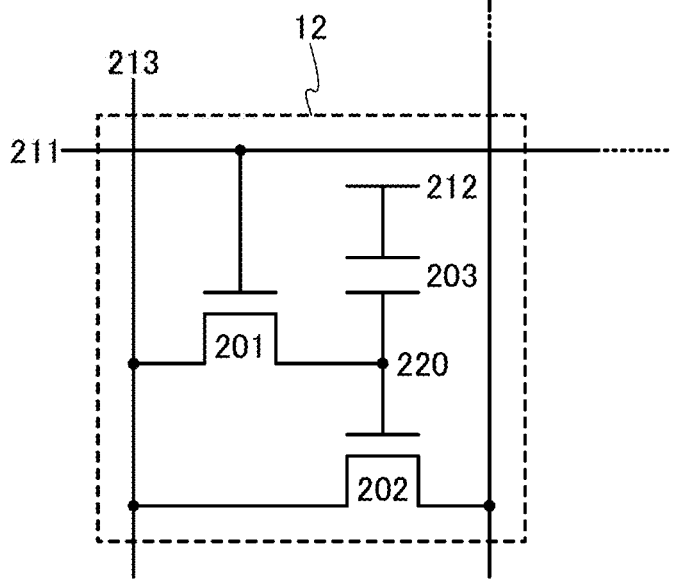

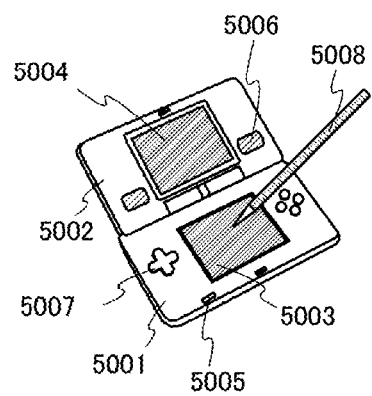
FIG. 18A
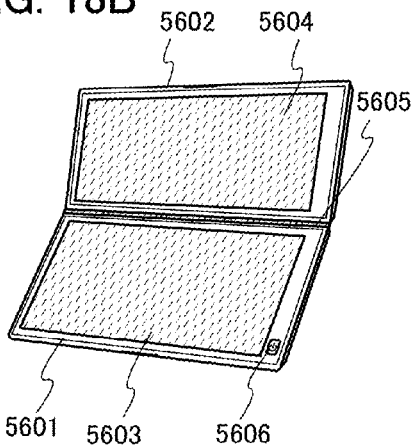
FIG. 18B
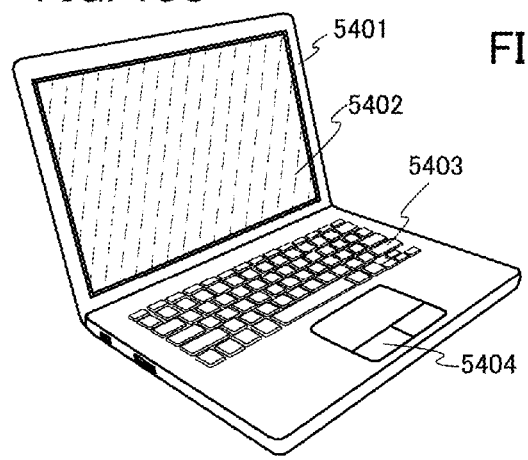
FIG. 18C
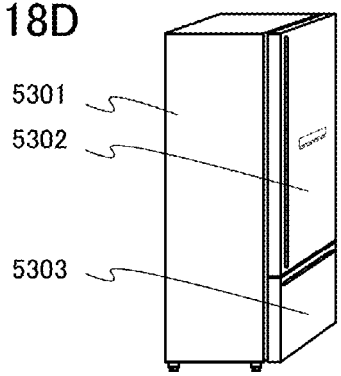
FIG. 18D
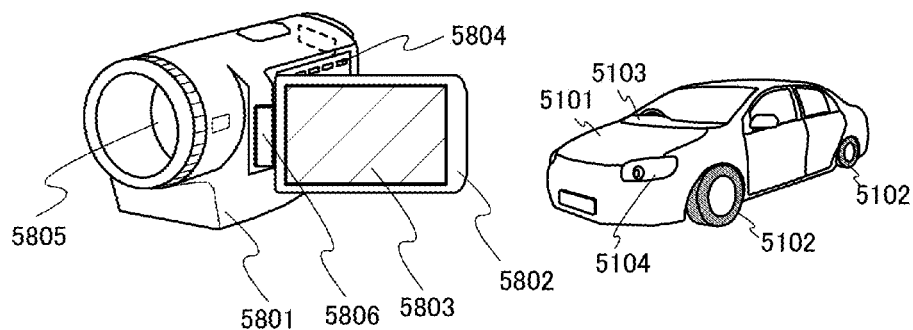
FIG. 18E
FIG. 18F

SEMICONDUCTOR DEVICE

BACKGROUND OF THE INVENTION

1. Field of the Invention

One embodiment of the present invention relates to a semiconductor device or a driving method thereof.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Another embodiment of the present invention relates to a semiconductor device, a display device, a light-emitting device, a power storage device, a memory device, or a driving method or manufacturing method thereof.

2. Description of the Related Art

Patent Document 1 discloses a semiconductor device that includes a transistor using an oxide semiconductor film and a transistor using single crystal silicon. According to Patent Document 1, the transistor using an oxide semiconductor film has an extremely low off-state current.

REFERENCE

Patent Document

[Patent Document 1] Japanese Published Patent Application No. 2012-256400

SUMMARY OF THE INVENTION

An object of one embodiment of the present invention is to provide a novel semiconductor device or a driving method thereof.

Another object of one embodiment of the present invention is to provide a semiconductor device with a low off-state current or a driving method thereof. Another object of one embodiment of the present invention is to provide a low-power-consumption semiconductor device or a driving method thereof. Another object of one embodiment of the present invention is to provide a highly reliable semiconductor device or a driving method thereof. Another object of one embodiment of the present invention is to provide a semiconductor device capable of operating at a high speed or a driving method thereof.

One embodiment of the present invention does not necessarily achieve all the objects listed above and only needs to achieve at least one of the objects. The description of the above objects does not disturb the existence of other objects. Other objects are apparent from and can be derived from the description of the specification, the drawings, the claims, and the like.

A semiconductor device of one embodiment of the present invention includes a cell array and a driver circuit. The cell array includes a first cell and a second cell. The first cell includes a first transistor, a second transistor, and a first capacitor. The second cell includes a third transistor, a fourth transistor, and a second capacitor. The driver circuit is electrically connected to the first cell and the second cell. A gate of the first transistor is electrically connected to a first wiring. One of a source and a drain of the first transistor is electrically connected to a second wiring. The other of the source and the drain of the first transistor is electrically connected to a gate of the second transistor and one electrode of the first capacitor. One of a source and a drain of the second transistor is electrically connected to the second wiring. The other of the source and the drain of the second transistor is electrically connected to a third wiring. The other electrode of the first capacitor is electrically connected to a fourth wiring. A gate of the third transistor is electrically connected to a fifth wiring. One of a source and a drain of the third transistor is electrically connected to a sixth wiring. The other of the source and the drain of the third transistor is electrically connected to a gate of the fourth transistor and one electrode of the second capacitor. One of a source and a drain of the fourth transistor is electrically connected to the sixth wiring. The other of the source and the drain of the fourth transistor is electrically connected to the third wiring. The other electrode of the second capacitor is electrically connected to a seventh wiring. Each of the first transistor and the third transistor includes an oxide semiconductor in a channel formation region. The sixth wiring has a function of transmitting a signal different from a signal supplied to the second wiring.

In the semiconductor device of one embodiment of the present invention, the conductivity type of the second transistor may be different from that of the fourth transistor.

In the semiconductor device of one embodiment of the present invention, the fourth wiring may have a function of transmitting a signal for controlling a potential of the gate of the second transistor, and the seventh wiring may have a function of transmitting a fixed potential.

The semiconductor device of one embodiment of the present invention may have a function of performing a first operation in which data read from the first cell is written to the second cell, and a second operation in which data read from the second cell is written to the first cell.

In the semiconductor device of one embodiment of the present invention, the first operation is performed by a first step of supplying a potential of the one electrode of the first capacitor to the third wiring through the first transistor, the second wiring, and the second transistor, and a second step of supplying a potential of the third wiring to the one electrode of the second capacitor through the fourth transistor, the sixth wiring, and the third transistor. The second operation is performed by a third step of supplying a potential of the one electrode of the second capacitor to the third wiring through the third transistor, the sixth wiring, and the fourth transistor, and a fourth step of supplying the potential of the third wiring to the one electrode of the first capacitor through the second transistor, the second wiring, and the first transistor.

According to one embodiment of the present invention, a novel semiconductor device or a driving method thereof can be provided.

Another embodiment of the present invention provides a semiconductor device with a low off-state current or a driving method thereof. Another embodiment of the present invention provides a low-power-consumption semiconductor device or a driving method thereof. Another embodiment of the present invention provides a highly reliable semiconductor device or a driving method thereof. Another embodiment of the present invention provides a semiconductor device capable of operating at a high speed or a driving method thereof.

Note that the description of these effects does not disturb the existence of other effects. One embodiment of the present invention does not necessarily achieve all the above effects. Other effects will be apparent from and can be derived from the description of the specification, the drawings, the claims, and the like.

BRIEF DESCRIPTION OF THE DRAWINGS

In the accompanying drawings:

FIG. 2 is a circuit diagram illustrating an example of a structure of a semiconductor device;

FIGS. 18A to 18F illustrate electronic devices;

DETAILED DESCRIPTION OF THE INVENTION

Embodiments of the present invention will be described in detail below with reference to the accompanying drawings. Note that the present invention is not limited to the following description and it is easily understood by those skilled in the art that the mode and details can be variously changed without departing from the scope and spirit of the present invention. Therefore, the present invention should not be construed as being limited to the description in the following embodiments.

One embodiment of the present invention includes, in its category, a radio frequency (RF) tag, a semiconductor display device, an integrated circuit, and any other devices. The display device includes, in its category, a display device including an integrated circuit, such as a liquid crystal display device, a light-emitting device in which a light-emitting element typified by an organic light-emitting element is provided in each pixel, an electronic paper, a digital micromirror device (DMD), a plasma display panel (PDP), and a field emission display (FED).

(Embodiment 1)

In this embodiment, a structure example of one embodiment of the present invention will be described.

Figure 1:
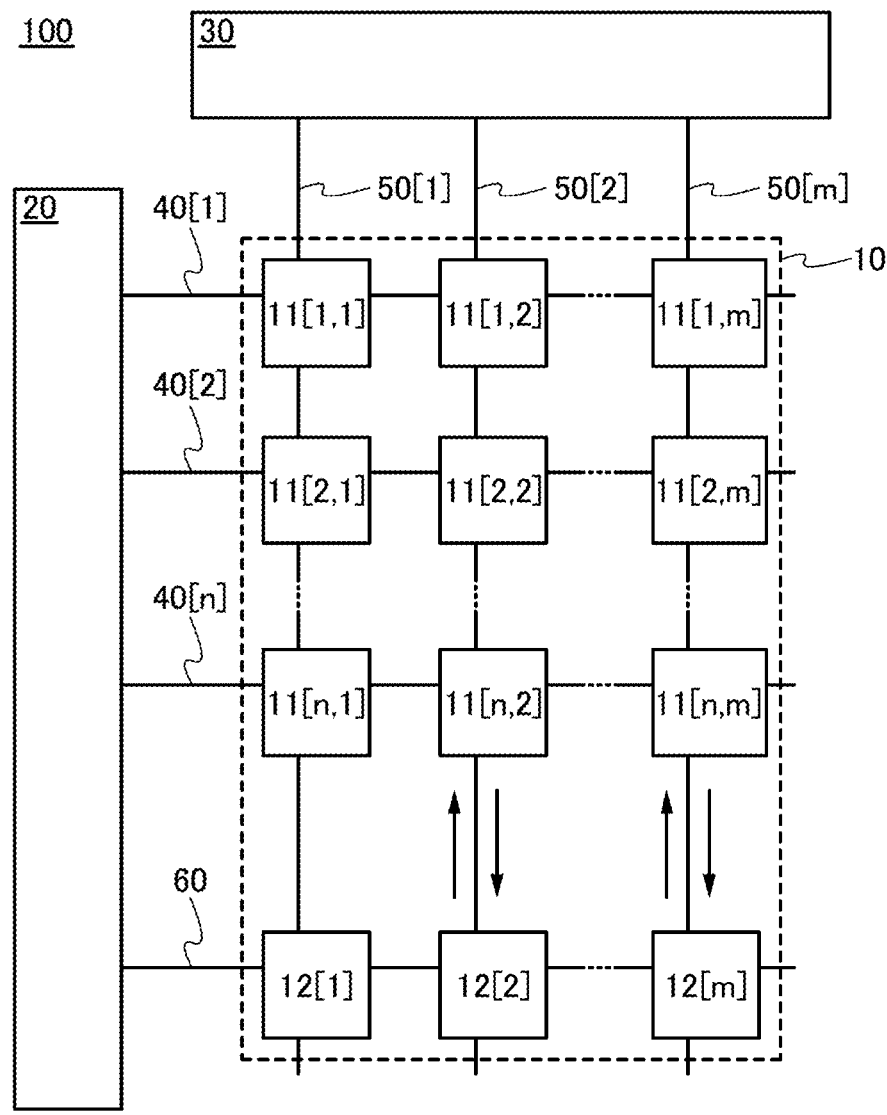
FIG. 1 illustrates an example of a structure of a semiconductor device.

FIG. 1 illustrates a structure example of a semiconductor device 100 of one embodiment of the present invention. The semiconductor device 100 includes a cell array 10, a circuit 20, and a circuit 30.

The cell array 10 includes a plurality of cells 11 and a plurality of cells 12. Shown here is an example in which the cells 11 are provided in n rows and m columns (n and m are natural numbers) and the cells 12 are provided in one row and m columns. In other words, the cell array 10 includes n×m cells 11 (cells 11[1,1] to [n,m]) and 1×m cells 12 (cells 12[1] to [m]). The cells 11 and 12 each serve as a memory cell that has a function of storing predetermined data.

The circuit 20 is connected to the cells 11[1,1] to [n,m] through a plurality of wirings 40 (wirings 40[1] to [n]), and connected to the cells 12[1] to [m] through a wiring 60. The circuit 20 is a driver circuit that has a function of supplying a signal for selecting the cells 11 in a certain row to the wirings 40[1] to [n], and a function of supplying a signal for selecting the plurality of cells 12 to the wiring 60. Hereinafter, the signal for selecting the cells 11 or the cells 12 is also referred to as a selection signal.

Note that the each of the wirings 40 can include a plurality of wirings. In that case, different signals can be supplied to the plurality of wirings. For example, the wiring 40[1] includes two wirings and each of the cells 11[1,1] to [1,m] is connected to the two wirings. In that case, different signals can be supplied to the two wirings. Similarly, the wiring 60 can include a plurality of wirings.

The circuit 30 is connected to the cells 11[1,1] to [n,m] and the cells 12[1] to [m] through a plurality of wirings 50 (wirings 50[1] to [m]). The circuit 30 is a driver circuit that has a function of writing data to the cells 11 and the cells 12 and reading data from the cells 11 and the cells 12. Specifically, the circuit 30 has a function of supplying a potential corresponding to data to be written to the cells 11 and the cells 12 (hereinafter also referred to as a writing potential) to the wirings 50[1] to [m], and a function of reading data stored in the cells 11 and the cells 12 from the potential of the wirings 50[1] to [m]. The circuit 30 may also have a function of precharging the wirings 50[1] to [m].

Note that the each of the wirings 50 can include a plurality of wirings. In that case, different signals can be supplied to the plurality of wirings. For example, the wiring 50[1] includes two wirings and each of the cells 11[1,1] to [n,1] and the cell 12[1] is connected to the two wirings. In that case, different signals can be supplied to the two wirings.

Data is written to the cells 11 in the following manner. A selection signal is supplied to one of the wirings 40 to select the cells 11 in a certain row, and a writing potential is supplied from the circuit 30 to the cells 11 in the selected row through the wirings 50[1] to [m].

Here, each of the wirings 40[1] to [n] is connected to the plurality of cells 11. Hence, in the case where, for example, data is rewritten in the cell 11[1,1] and stored data is retained in the cells 11[1,2] to [1,m] in the above operation, the two steps are necessary: a writing potential is supplied to the wiring 50[1]; and data stored in the cells 11[1,2] to [1,m] are read and writing potentials corresponding to the data are supplied to the wirings 50[2] to [m].

Specifically, first, a selection signal is supplied to the wiring 40[1], thereby selecting the cells 11[1,1] to [1,m]. Then, a writing potential corresponding to data to be written is supplied to the wiring 50[1] connected to the cell 11[1,1]. Here, in the case where no writing potential is supplied to the wirings 50[2] to [m] while the cells 11[1,2] to [1,m] are selected, data stored in the cells 11[1,2] to [1,m] might be lost. Therefore, the following processing needs to be performed in the circuit 30 when the cells 11[1,2] to [1,m] are selected. The data stored in the cells 11[1,2] to [1,m] are read; then, writing potentials corresponding to the data are supplied to the wirings 50[2] to [m] so that the data are stored again in the cells 11[1,2] to [1,m].

As described above, when a selection signal is supplied to the wiring 40[1] while the wiring 40[1] is connected to the cells 11[1,1] to [1,m], the cells 11[1,2] to [1,m] as well as the cell 11[1,1] are selected. Therefore, even when data rewriting is performed only in the cell 11[1,1] and is not performed in the cells 11[1,2] to [1,m], the circuit 30 needs to perform reading and writing operation in order to maintain the data stored in the cells 11[1,2] to [1,m]. Such operation leads to a lower rewriting speed and increased power consumption in the circuit 30.

Furthermore, in the case where the data stored in the cells 11[1,2] to [1,m] are three- or more-level data, the potentials (analog values) of the wirings 50[2] to [m] need to be converted into digital values to read the data stored in the cells 11[1,2] to [1,m]; then, the digital values are converted into analog values again to be supplied to the wirings 50[2] to [m]. This leads to a further increase in the power consumption in the circuit 30 and a further decrease in the rewriting speed of the cells 11 as compared with the case of binary data.

In one embodiment of the present invention, by using the cells 12, the reading and writing operation of the circuit 30 is omitted in the cells 11 where data rewriting is not performed. Described below is an example of the operation in which data is rewritten in the cell 11[1,1] and is not rewritten in the cells 11[1,2] to [1,m].

First, a selection signal is supplied to the wiring 40[1] to select the cells 11[1,1] to [1,m]. Then, a writing potential corresponding to data to be written is supplied to the wiring 50[1] connected to the cell 11[1,1], whereby data rewriting is performed in the cell 11[1,1]. In contrast, in the cells 11[1,2] to [1,m] in which data rewriting is not performed, the reading and writing operation by the circuit 30 is not performed. Instead, the data stored in the cells 11[1,2] to [1,m] are transferred to the cells 12[2] to [m]. After that, the data transferred to the cells 12[2] to [m] are stored again in the cells 11[1,2] to [1,m]. As a result, the data in the cells 11[1,2] to [1,m] can be maintained without the reading and writing operation in the circuit 30. This results in a higher rewriting speed and lower power consumption in the circuit 30. In addition, it is possible to select only the cell 11 to which data is written, which offers a cell array capable of random access.

Note that one embodiment of the present invention is not limited to the example in which data rewriting is performed in the cell 11[1,1] and is not performed in the cells 11 [1,2] to [1,m]. The cell in which data rewriting is performed and the cell in which data rewriting is not performed can be selected freely among the cells 11[1,1] to [n,m].

Next, an example of the structure of the semiconductor device 100 will be described with reference to FIG. 2 to FIG. 5.

FIG. 2 illustrates an example of a specific structure of the cells 11 and 12. Note that the cell 11 in FIG. 2 corresponds to any one of the cells 11[1,1] to [n,m] in FIG. 1, and the cell 12 in FIG. 2 corresponds to any one of the cells 12[1] to [m] in FIG. 1.

The cell 11 includes a transistor 101, a transistor 102, and a capacitor 103. A gate of the transistor 101 is connected to a wiring 111, one of a source and a drain of the transistor 101 is connected to a wiring 113, and the other of the source and the drain is connected to a gate of the transistor 102 and one electrode of the capacitor 103. One of a source and a drain of the transistor 102 is connected to the wiring 113, and the other of the source and the drain is connected to a wiring 114. The other electrode of the capacitor 103 is connected to a wiring 112. The other of the source and the drain of the transistor 101, the gate of the transistor 102, and the one electrode of the capacitor 103 are connected to each other at a node 120.

The wiring 111 has a function of transmitting, for example, a signal for controlling the conductive state of the transistor 101. The wiring 112 has a function of transmitting a signal for controlling the gate potential of the transistor 102, specifically, a function of transmitting two or more different potentials. The wiring 113 has a function of transmitting, for example, a potential for controlling data writing to the cell 11 and data reading from the cell 11.

The cell 12 includes a transistor 201, a transistor 202, and a capacitor 203. A gate of the transistor 201 is connected to a wiring 211, one of a source and a drain of the transistor 201 is connected to a wiring 213, and the other of the source and the drain is connected to a gate of the transistor 202 and one electrode of the capacitor 203. One of a source and a drain of the transistor 202 is connected to the wiring 213, and the other of the source and the drain is connected to the wiring 114. The other electrode of the capacitor 203 is connected to a wiring 212. The other of the source and the drain of the transistor 201, the gate of the transistor 202, and the one electrode of the capacitor 203 are connected to each other at a node 220.

Here, the conductivity type of the transistor 102 is preferably different from that of the transistor 202. It is more preferable that the transistor 102 be a p-channel transistor and the transistor 202 be an n-channel transistor. This facilitates the writing operation, the reading operation, and the like in the cell array 10.

The wiring 211 has a function of transmitting, for example, a signal for controlling the conductive state of the transistor 201. The wiring 213 has a function of transmitting, for example, a signal for controlling data writing to the cell 12 and data reading from the cell 12. The wiring 212 has a function of transmitting a predetermined potential. Note that the wiring 212 may be a high potential power supply line or a low potential power supply line (such as a ground line). The predetermined potential may be a fixed potential (constant potential) or a varying potential, and is not limited to 0 V. Described here is the case where the wiring 212 is a low potential power supply line.

The wiring 213, which is different from the wiring 113, has a function of transmitting a signal different from that supplied to the wiring 113. Thus, the wiring 213 may have a potential different from that of the wiring 113.

The wiring 114 has a function of transmitting, for example, a potential for controlling data writing to the cells 11 and 12 and data reading from the cells 11 and 12. Specifically, the wiring 114 has a function of transmitting a writing potential corresponding to data to be written to the cell 11 or the cell 12. Moreover, the wiring 114 has a function of reading a potential corresponding to data stored in the cell 11 or the cell 12.

This embodiment shows, but is not limited to, an example in which the transistors 101, 201, and 202 are n-channel transistors and the transistor 102 is a p-channel transistor. Alternatively, the transistors 101, 102, 201, and 202 may each be an n-channel transistor or a p-channel transistor.

In the transistors 101, 102, 201, and 202, a variety of materials such as silicon, germanium, silicon germanium, and an oxide semiconductor can be used as a semiconductor where a channel formation region is formed.

Since the transistor 101 has a function of holding a potential of the node 120, the off-state current of the transistor 101 is preferably low, thereby preventing leakage of charge stored in the node 120 through the transistor 101. Consequently, the data stored in cell 11 can be retained for a long time. A transistor in which a channel formation region includes a semiconductor with a wider bandgap and lower intrinsic carrier density than silicon or the like can have an extremely low off-state current and thus is preferably used as the transistor 101. Examples of such a semiconductor include an oxide semiconductor having a band gap greater than or equal to twice the band gap of silicon. The off-state current of the transistor including an oxide semiconductor in a channel formation region (hereinafter also referred to as an OS transistor) can be extremely low as compared to that of a transistor formed using a material other than an oxide semiconductor, such as silicon or germanium. Hence, the transistor 101 is preferably an OS transistor, in which case the leakage of charge stored in the node 120 can be reduced efficiently. Note that the transistor 201 in the cell 12 is also preferably an OS transistor like the transistor 101.

The OS transistor can operate at high speed when miniaturized. Therefore, when the OS transistor is used as the transistors 101, 102, 201, and 202, the cell 11 and the cell 12 can serve as a memory cell whose writing speed and reading speed is less than or equal to 10 ns, preferably less than or equal to 5 ns. In that case, the channel length of the OS transistor used as the transistors 101, 102, 201, and 202 is shorter than or equal to 100 nm, preferably shorter than or equal to 60 nm, more preferably shorter than or equal to 40 nm, and still more preferably shorter than or equal to 30 nm.

The transistor 102 needs high current supply capability in order to increase the writing speed and reading speed of data stored in the cell 11. Thus, the transistor 102 may be formed using a material other than an oxide semiconductor, for example, silicon. This can increase the current supply capability of the transistor 102. Similarly to the transistor 102, the transistor 202 in the cell 12 is also preferably formed using a material other than an oxide semiconductor, for example, silicon. A transistor using an oxide semiconductor and a transistor using a material other than an oxide semiconductor are thus used in combination depending on intended functions; thus, both long-term data retention and high-speed circuit operation can be achieved.

Furthermore, a p-channel transistor formed using a material other than an oxide semiconductor (e.g., silicon) can be formed easier than a p-channel OS transistor. Thus, some of the transistors 101, 102, 201, and 202 that are used as p-channel transistors are preferably formed using a material other than an oxide semiconductor. This results in an increased yield in the manufacturing process of the semiconductor device.

Figure 3:
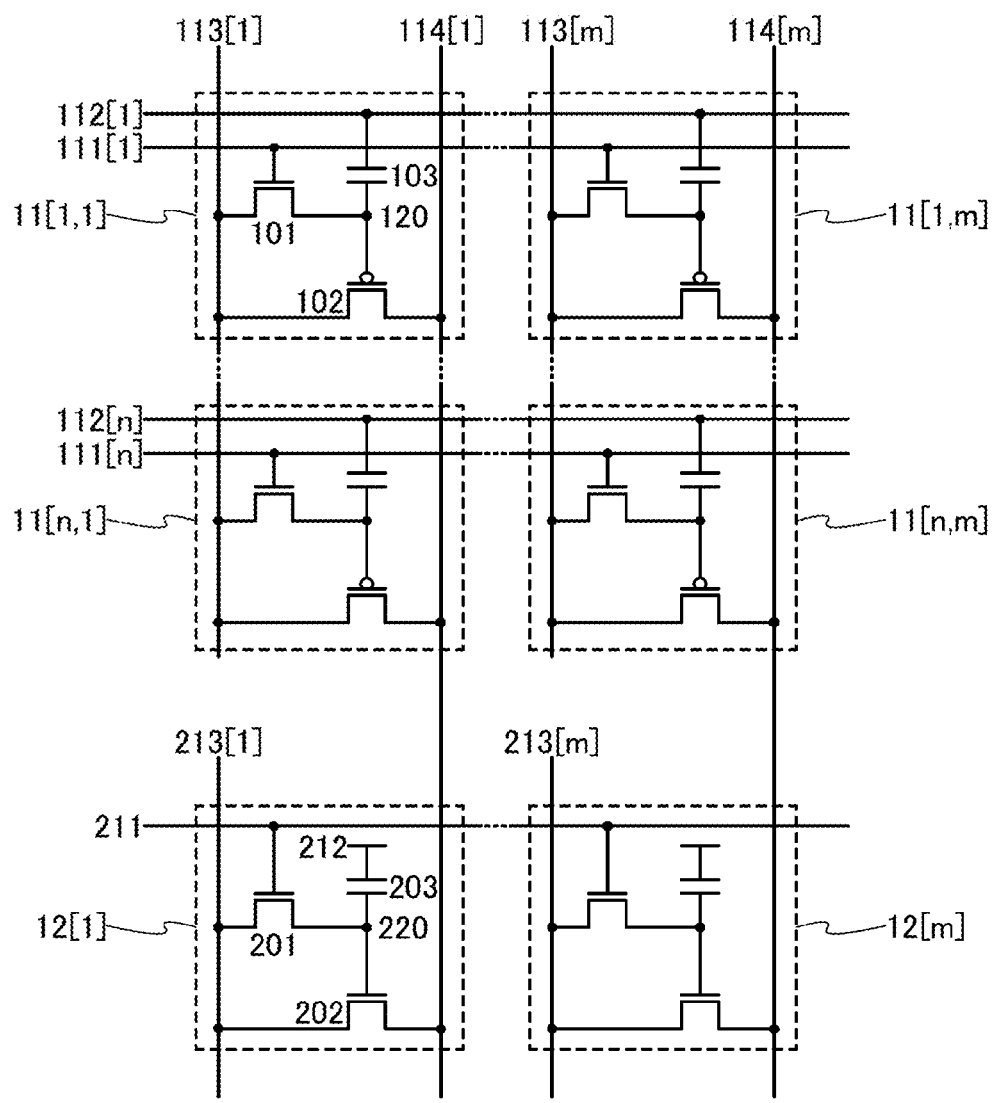
FIG. 3 is a circuit diagram illustrating an example of a structure of a semiconductor device.

FIG. 3 illustrates a structure of the cell array 10 including n×m cells 11 (cells 11[1,1] to [n,m]) and 1×m cells 12 (cells 12[1] to [m]). The cell array 10 includes a plurality of wirings 111 (wirings 111[1] to [n]), a plurality of wirings 112 (wirings 112 [1] to [n]), the wiring 211, a plurality of wirings 113 (wirings 113 [1] to [m]), a plurality of wirings 114 (wirings 114[1] to [m]), and a plurality of wirings 213 (wirings 213[1] to [m]). The cells 11 in the same row share each of the wirings 111[1] to [n], the cells 11 in the same column share each of the wirings 113[1] to [m], the cells 11 and the cells 12 in the same column share each of the wirings 114[1] to [m], and the cells 12[1] to [m] share the wiring 211.

Here, the cell array 10 includes the n×m cells 11 and the m cells 12; thus, the area occupied by the cells 12 in the cell array 10 is smaller than that occupied by the cells 11. Therefore, an increase in the area of the cell array 10 with an increase in the area of the cells 12 is smaller than that with an increase in the area of the cells 11. This means that the area of the cell array 10 is not much increased even when the area of the cells 12 is larger than that of the cells 11.

With an increase in the area of the cells 12, the ratio of channel width W to channel length L (W/L) of the transistor 202 in each of the cells 12 can be made higher than the W/L of the transistor 102 in each of the cells 11. This results in a higher current supply capability of the transistor 202, so that the potential of the wiring 114 can be switched in a short time when data is transferred and rewritten, increasing the operation speed of the cell array 10.

Also with an increase in the area of the cells 12, the area of the capacitor 203 in each of the cells 12 can be made larger than that of the capacitor 103 in each of the cells 11. In other words, the capacitor 203 has a higher capacitance than the capacitor 103. This suppresses a change in the potential of the node 220, so that data to be rewritten to the cell 11 can be maintained properly in the cell 12.

Also with an increase in the area of the cells 12, the W/L of the transistor 201 in each of the cells 12 can be made higher than the W/L of the transistor 101 in each of the cells 11. This results in a higher operation speed of the transistor 201, so that data can be transferred from the cell 11 to the cell 12 at a high speed.

In one embodiment of the present invention, data stored in the cell 11 can be output to the wiring 114 to be written to the cell 12. Further, data stored in the cell 12 can be output to the wiring 114 to be written to the cell 11. Accordingly, data can be transferred from the cell 11 to the cell 12 and data stored in the cell 12 can be rewritten to the cell 11. As a result, data in the cells 11[1,2] to [1,m] can be maintained without the reading and writing operation in the circuit 30 in FIG. 1. This results in a higher rewriting speed and lower power consumption in the circuit 30.

Figure 4:
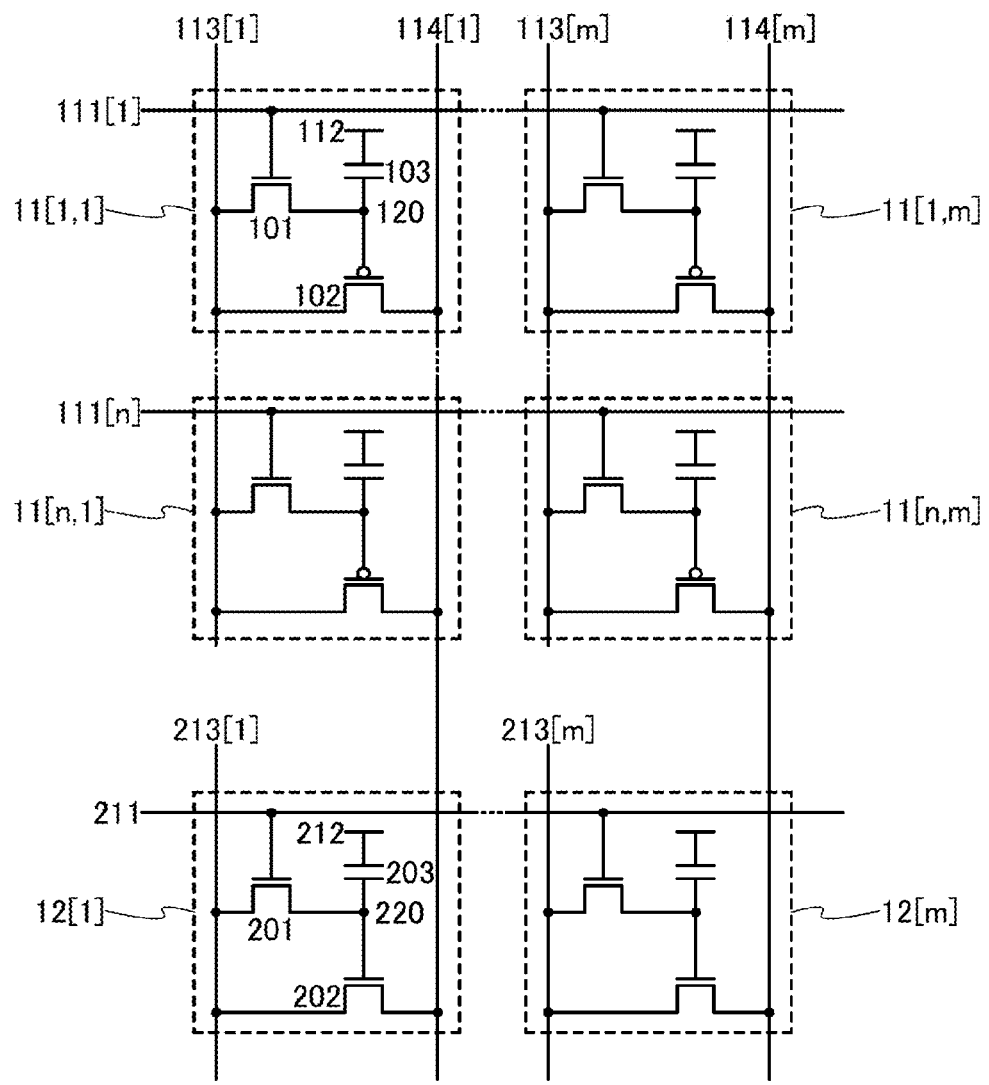
FIG. 4 is a circuit diagram illustrating an example of a structure of a semiconductor device.
Figure 5:
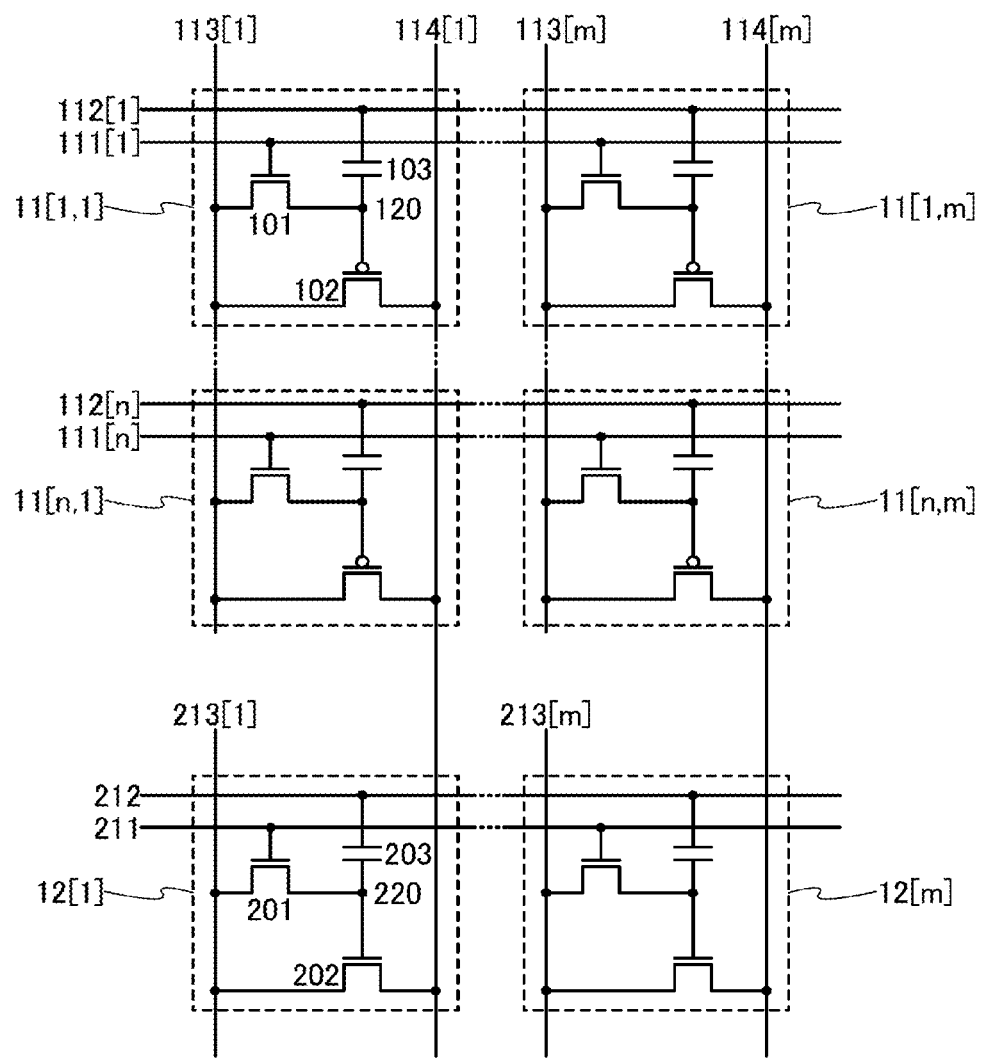
FIG. 5 is a circuit diagram illustrating an example of a structure of a semiconductor device.

Note that in FIG. 3, the other electrode of the capacitor 103 is connected to the wiring 112 that has a function of transmitting a signal for controlling the conductive state of the transistor 102, and the other electrode of the capacitor 203 is connected to the wiring 212 that has a function of transmitting a predetermined potential; however, one embodiment of the present invention is not limited to this example. For example, the wiring 112 connected to the other electrode of the capacitor 103 may be a wiring that has a function of transmitting a predetermined potential (FIG. 4). Alternatively, the wiring 212 connected to the other electrode of the capacitor 203 may be a wiring that has a function of transmitting a signal for controlling the conductive state of the transistor 202 (FIG. 5). Further alternatively, the other electrode of the capacitor 103 may be connected to the wiring 112 having a function of transmitting a predetermined potential and the other electrode of the capacitor 203 may be connected to the wiring 212 having a function of transmitting a signal for controlling the conductive state of the transistor 202. In addition, in FIG. 3 to FIG. 5, the transistor 102 may be an n-channel transistor and the transistor 202 may be a p-channel transistor.

Figure 6:
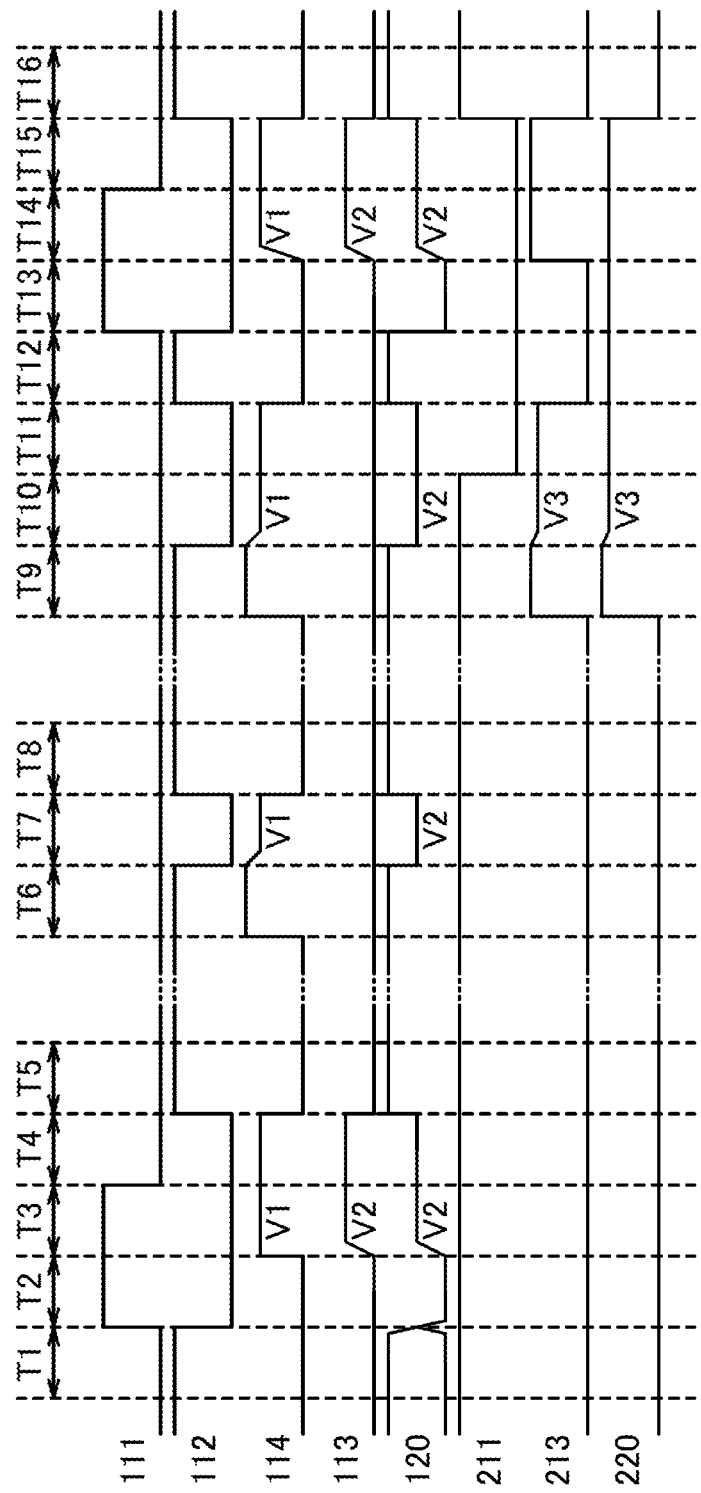
FIG. 6 is a timing chart.

Next, the operation of the cell array 10 illustrated in FIG. 2 will be described in detail with reference to a timing chart shown in FIG. 6. Note that in FIG. 6, periods T1 to T5 are the periods during which data is written to the cell 11; periods T6 to T8 are the periods during which data is read from the cell 11; and periods T9 to T16 are the periods during which data is transferred from the cell 11 to the cell 12 and rewritten to the cell 11.

<Data Writing>

First, the periods T1 to T5, data writing periods, will be described. The data writing operation is roughly divided into a step of making the transistors 101 and 102 conductive and a step of making the wiring 114 have a potential V1 so that the node 120 has a potential V2.

First, in the period T1, the potential of the wiring 111 is low and the transistor 101 is off. The potentials of the wirings 113 and 114 are also low. The potential of the wiring 211 is high and the transistor 201 is on. The potential of the wiring 213 is low. Note that the potential of the node 220 is also low because the node 220 is connected to the wiring 213 through the transistor 201. Further, the transistor 202 is off.

Next, in the period T2, the potential of the wiring 111 is high so that the transistor 101 is on. As a result, the potential of the wiring 113 (low-level potential) is supplied to the node 120 through the transistor 101, whereby the transistor 102 is turned on. Further, the potential of the wiring 112 is low.

Then, in the period T3, the potential of the wiring 113 is in a floating state. Further, the potential of the wiring 114 is V1, which is data to be written to the cell 11. Here, the wiring 113 and the node 120 are connected to the wiring 114 through the transistor 102; hence, the potentials of the wiring 113 and the node 120 approach the potential V1 of the wiring 114. Specifically, the potentials of the wiring 113 and the node 120 approach a potential V2, which is lower than the potential V1 of the wiring 114. The difference between the potential V1 and the potential V2 is approximately equal to the threshold voltage of the transistor 102. As the potentials of the wiring 113 and the node 120 approach the potential V2, a potential difference between the gate and the source of the transistor 102 becomes smaller, reducing the amount of current (Id) flowing between the source and the drain of the transistor 102. Finally, the potentials of the wiring 113 and the node 120 reach V2 and the gate potential of the transistor 102 also reaches V2. Thus, the potential difference between the gate and the source of the transistor 102 is approximately equal to the threshold voltage of the transistor 102, so that the transistor 102 is turned off.

As described above, data is written to the cell 11 by supplying the potential V1 to the wiring 114 and changing the potential of the node 120 to V2.

Note that the level of the potential V1 can be determined freely. Hence, various data can be written to the cell 11 so that multilevel data can be retained easily.

Next, in the period T4, the potential of the wiring 111 is low and the transistor 101 is off. As a result, the potential of the node 120 is held. Note that when an OS transistor is used as the transistor 101, the off-state current of the transistor 101 can be extremely low, which enables the potential of the node 120 to be held for a long period.

Then, in the period T5, the potentials of the wirings 113 and 114 are low. Moreover, the potential of the wiring 112 is high and the potential of the node 120 is high, whereby the transistor 102 is off. The cell 11 in the period T5 is in the same state as in the period T1 except for the potential of the node 120.

Through the above operation, data is written to the cell 11.

<Data Reading>

Next, the periods T6 to T8, data reading periods, will be described. The data reading operation is roughly divided into a step of precharging the wiring 114 and a step of making the transistor 102 on so that the wiring 114 has the potential V1.

First, in the period T6, the wiring 114 is precharged so as to have a high-level potential. Note that the potential of the wiring 114 is preferably higher than the potential V1. The potential of the wiring 111 is low and the transistor 101 is off. The potential of the wiring 112 is high and the transistor 102 is off.

Then, in the period T7, the potential of the wiring 114 is in a floating state. In addition, the potential of the wiring 112 is low and the potential of the node 120 is changed to V2. At this time, the transistor 102 is turned on, and a current (Id) based on the potential (V2) of the gate of the transistor 102 and the potential of the wiring 114 flows between the source and the drain of the transistor 102. The potential of the wiring 114 that is in a floating state approaches the potential of the wiring 113 (low level). Then, the potential of the wiring 114 is reduced to V1 and the difference between the potential (V2) of the node 120 and the potential of the wiring 114 is lower than or equal to the threshold voltage of the transistor 102; as a result, the transistor 102 is turned off so that the potential of the wiring 114 is kept V1.

Here, the potential V1 is equal to the potential (writing potential) of the wiring 114 in the data writing (period T3). In other words, the data that has been written to the cell 11 in the period T3 can be read from the wiring 114 as the potential V1.

Next, in the period T8, the potentials of the wirings 113 and 114 are low. Further, the potentials of the wiring 112 and the node 120 are high.

Through the above operation, the data stored in the cell 11 can be read as the potential of the wiring 114 in accordance with the potential of the node 120 and the threshold voltage of the transistor 102. As a result, data can be read with little variation even when the threshold voltage of the transistor 102 varies among the plurality of cells 11. Moreover, data can be read with little variation even when the threshold voltage of the transistor 102 in one of the cells 11 varies due to degradation over time.

Furthermore, as described above, the cell 11 has little variation in the potential of the wiring 114 in data writing and data reading, so that various data can be written to the cell 11 and read from the cell 11 properly. Therefore, multilevel data can be stored properly in the cell to increase the degree of integration of the cell 11.

In addition, it is not necessary to perform verify operation to determine whether writing is performed properly, resulting in a higher operation speed of the semiconductor device 100.

<Data Transfer and Rewriting>

Next, the periods T9 to T16, data transfer and rewriting periods, will be described. The data transfer and rewriting operation is roughly divided into a step of writing data read from the cell 11 to the cell 12 and a step of writing data read from the cell 12 to the cell 11.

First, in the period T9, the wiring 114 is precharged so as to have a high-level potential. Note that the potential of the wiring 114 is preferably higher than the potential V1. The potential of the wiring 111 is low and the transistor 101 is off. The potential of the wiring 112 is high and the transistor 102 is off.

Further, in the period T9, the potential of the wiring 211 is high and the transistor 201 is on. The potential of the wiring 213 is high. As a result, the potential of the wiring 213 (high-level potential) is supplied to the node 220 through the transistor 201, whereby the transistor 202 is turned on.

Then, in the period T10, the potential of the wiring 114 is in a floating state. In addition, the potential of the wiring 112 is low and the potential of the node 120 is changed to V2. At this time, the transistor 102 is turned on, and a current (Id) based on the potential (V2) of the gate of the transistor 102 and the potential of the wiring 114 flows between the source and the drain of the transistor 102. The potential of the wiring 114 that is in a floating state approaches the potential of the wiring 113 (low level). Then, the potential of the wiring 114 is reduced to V1 and the difference between the potential (V2) of the node 120 and the potential of the wiring 114 is lower than or equal to the threshold voltage of the transistor 102; as a result, the transistor 102 is turned off so that the potential of the wiring 114 is kept V1.

Further, in the period T10, the potential of the wiring 213 is in a floating state. Here, the wiring 213 and the node 220 are connected to the wiring 114 through the transistor 202; hence, the potentials of the wiring 213 and the node 220 approach the potential V1 of the wiring 114. Specifically, the potentials of the wiring 213 and the node 220 approach a potential V3, which is higher than the potential V1 of the wiring 114. The difference between the potential V1 and the potential V3 is approximately equal to the threshold voltage of the transistor 202. As the potentials of the wiring 213 and the node 220 approach the potential V3, a potential difference between the gate and the source of the transistor 202 becomes smaller, reducing the amount of current (Id) flowing between the source and the drain of the transistor 202. Finally, the potentials of the wiring 213 and the node 220 reach V3 and the gate potential of the transistor 202 also reaches V3. Thus, the potential difference between the gate and the source of the transistor 202 is approximately equal to the threshold voltage of the transistor 202, so that the transistor 202 is turned off.

Next, in the period T11, the potential of the wiring 211 is low and the transistor 201 is off. As a result, the potential of the node 220 is held. Note that when an OS transistor is used as the transistor 201, the off-state current of the transistor 201 can be extremely low, which enables the potential of the node 220 to be held for a long period.

Next, in the period T12, the potential of the wiring 114 is low. Note that the potential of the wiring 114 is preferably lower than the potential V1. Further, the potentials of the wiring 112 and the node 120 are high. The potential of the wiring 211 is low and the transistor 201 is off. The potential of the wiring 213 is low. Note that the potential of the wiring 213 may be in a floating state.

Next, in the period T13, the potential of the wiring 111 is high and the transistor 101 is on. As a result, the potential of the wiring 113 (low-level potential) is supplied to the node 120 through the transistor 101, whereby the transistor 102 is turned on. Further, the potential of the wiring 112 is low.

Then, in the period T14, the potential of the wiring 114 is in a floating state. In addition, the potential of the wiring 213 is high. At this time, the transistor 202 is turned on, and a current (Id) based on the potential (V3) of the gate of the transistor 202 and the potential of the wiring 114 flows between the source and the drain of the transistor 202. The potential of the wiring 114 that is in a floating state approaches the potential of the wiring 213 (high level). Then, the potential of the wiring 114 is increased to V1 and the difference between the potential (V3) of the node 220 and the potential of the wiring 114 is lower than or equal to the threshold voltage of the transistor 202; as a result, the transistor 202 is turned off so that the potential of the wiring 114 is kept V1.

Then, in the period T14, the potential of the wiring 113 is in a floating state. Here, the wiring 113 and the node 120 are connected to the wiring 114 through the transistor 102; hence, the potentials of the wiring 113 and the node 120 approach the potential V1 of the wiring 114. Specifically, the potentials of the wiring 113 and the node 120 approach a potential V2, which is lower than the potential V1 of the wiring 114. The difference between the potential V1 and the potential V2 is approximately equal to the threshold voltage of the transistor 102. As the potentials of the wiring 113 and the node 120 approach the potential V2, a potential difference between the gate and the source of the transistor 102 becomes smaller, reducing the amount of current (Id) flowing between the source and the drain of the transistor 102. Finally, the potentials of the wiring 113 and the node 120 reach V2 and the gate potential of the transistor 102 also reaches V2. Thus, the potential difference between the gate and the source of the transistor 102 is approximately equal to the threshold voltage of the transistor 102, so that the transistor 102 is turned off.

Next, in the period T15, the potential of the wiring 111 is low and the transistor 101 is off. As a result, the potential of the node 120 is held.

Next, in the period T16, the potentials of the wirings 113 and 114 are low. The potential of the wiring 213 is also low. Further, the potentials of the wiring 112 and the node 120 are high, so that the transistor 102 is off. The potential of the wiring 211 is high. Note that the potential of the node 220 is low because the node 220 is connected to the wiring 213 through the transistor 201. Further, the transistor 202 is off.

Through the above operation, data can be transferred from the cell 11 to the cell 12 and data stored in the cell 12 can be rewritten to the cell 11.

In the semiconductor device of one embodiment of the present invention, a writing potential is supplied to the cell 11 in which data rewriting is to be performed, whereby data is written. Meanwhile, in the cell 11 in which data rewriting is not to be performed, the data is transferred to the cell 12 and then the transferred data is rewritten to the cell 11. As a result, the data stored in the cell 11 in which data rewriting is not to be performed can be maintained without the reading and writing operation in the driver circuit. This results in a higher rewriting speed and lower power consumption in the driver circuit.

In addition, the data stored in the cell 11 can be read as the potential of the wiring 114 in accordance with the potential of the node 120 and the threshold voltage of the transistor 102. As a result, data can be read with little variation even when the threshold voltage of the transistor 102 varies among the plurality of cells 11. Moreover, data can be read with little variation even when the threshold voltage of the transistor 102 in one of the cells 11 varies due to degradation over time.

Furthermore, the cell 11 has little variation in the potential of the wiring 114 in data writing and data reading, so that various data can be written to the cell 11 and read from the cell 11 properly. Therefore, multilevel data can be stored properly in the cell to increase the degree of integration of the cell 11.

In addition, it is not necessary to perform verify operation to determine whether writing is performed properly in the cell 11, resulting in a higher operation speed of the semiconductor device 100.

This embodiment can be combined with any of the other embodiments as appropriate.

(Embodiment 2)

In this embodiment, an example of a driving method of one embodiment of the present invention will be described.

Figure 7:
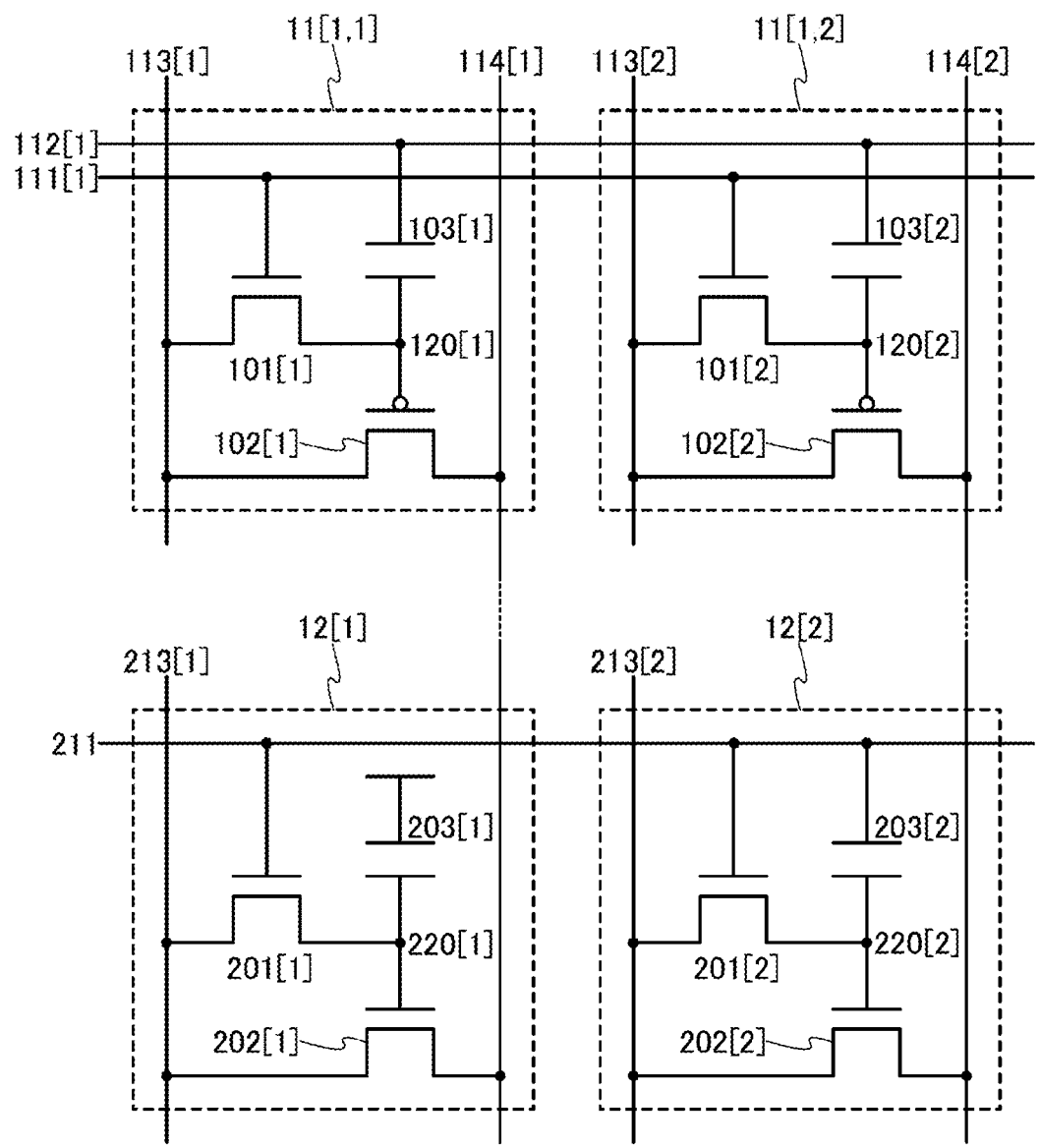
FIG. 7 is a circuit diagram illustrating an example of a structure of a semiconductor device.

FIG. 7 illustrates part of the cell array 10, the cells 11[1,1] and [1,2] and the cells 12[1] and [2]. The cell 11[1,1]

includes the transistor 101[1], the transistor 102[1], and the capacitor 103[1]. The cell 11[1,2] includes the transistor 101[2], the transistor 102[2], and the capacitor 103[2]. The cell 12[1] includes the transistor 201[1], the transistor 202[1], and the capacitor 203[1]. The cell 12[2] includes the transistor 201[2], the transistor 202[2], and the capacitor 203[2]. Note that the structure of each of the cells 11[1,1] and [1,2] is similar to that of the cell 11 in FIG. 2, and the structure of each of the cells 12[1] and [2] is similar to that of the cell 12 in FIG. 2; thus, detailed description of the connection relationship between the components is omitted.

In one embodiment of the present invention, writing new data to one of the cells 11 can be performed at the same time as data transfer and rewriting in another one of the cells 11. Described here is the operation in which data transfer and rewriting are performed in the cell 11[1,1] without writing of new data, while new data is written to the cell 11[1,2].

Figure 8:
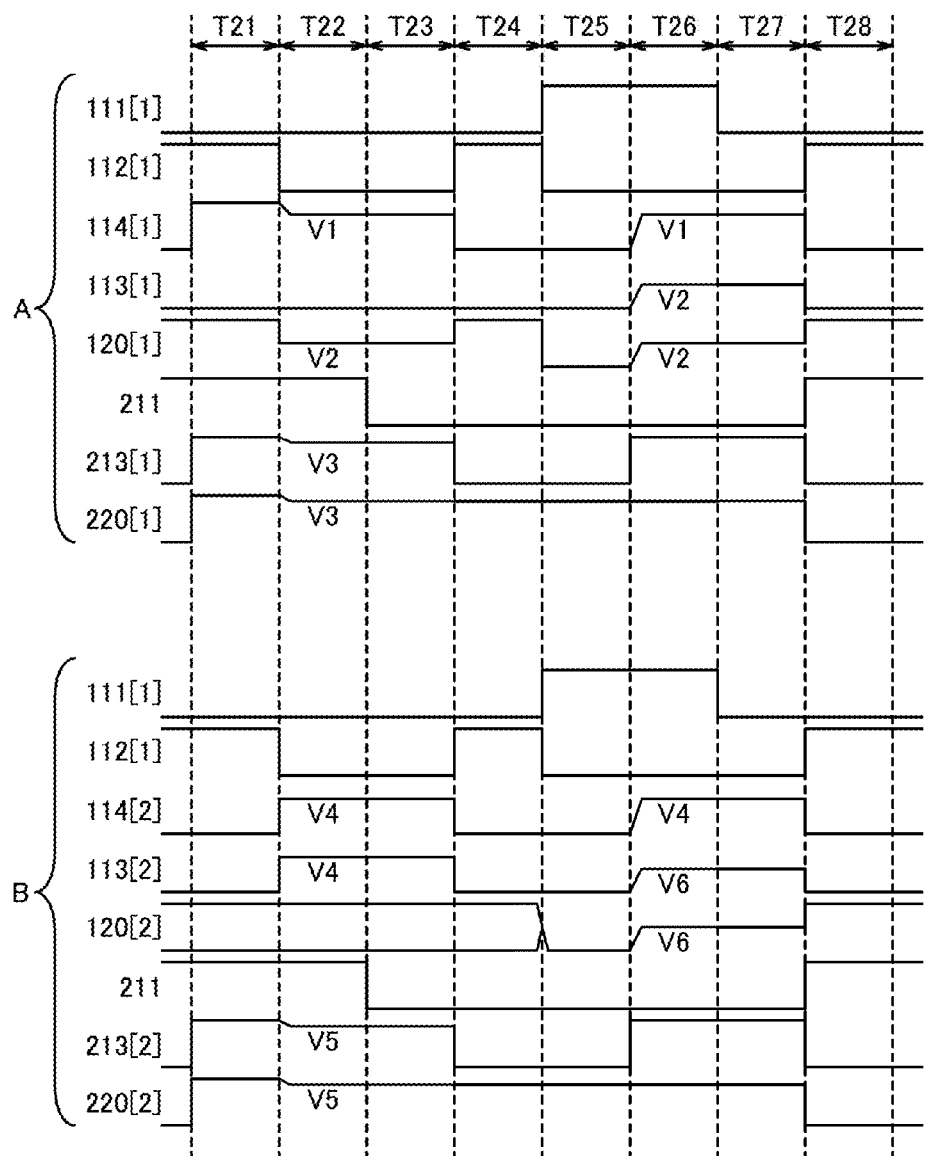
FIG. 8 is a timing chart.

Specific operation of the cells 11[1,1] and [1,2] and the cells 12[1] and [2] illustrated in FIG. 7 will be described with reference to a timing chart shown in FIG. 8. In the timing chart, A represents the operation of the cell 11[1,1] and the cell 12[1] in which data transfer and rewriting are performed, and B represents the operation of the cell 11[1,2] and the cell 12[2] in which data writing is performed. Note that the timing chart A is similar to the operation in the periods T9 to T16 in FIG. 6 (data transfer and rewriting operation); hence, the operation B will be mainly described below.

First, in the period T21, the potential of the wiring 211 is high and the transistor 201[2] is on. The potential of the wiring 213[2] is also high. As a result, the potential of the wiring 213[2] (high-level potential) is supplied to the node 220[2] through the transistor 201[2], whereby the transistor 202[2] is turned on.

Next, in the period T22, the potential of the wiring 213[2] is in a floating state. Further, the potentials of the wiring 113[2] and the wiring 114[2] are V4. Note that the potential V4 is data to be written to the cell 11[1,2], and is supplied from the circuit 30 (see FIG. 1). The potential of the wiring 113[2] may be in a floating state. Here, the wiring 213[2] and the node 220[2] are connected to the wiring 114[2] through the transistor 202[2]; hence, the potential of the wiring 213[2] approaches the potential V4 of the wiring 114[2]. Specifically, the potentials of the wiring 213[2] and the node 220[2] approach a potential V5, which is higher than the potential V4 of the wiring 114. The difference between the potential V4 and the potential V5 is approximately equal to the threshold voltage of the transistor 202[2]. As the potentials of the wiring 213[2] and the node 220[2] approach the potential V5, a potential difference between the gate and the source of the transistor 202[2] becomes smaller, reducing the amount of current (Id) flowing between the source and the drain of the transistor 202[2]. Finally, the potentials of the wiring 213[2] and the node 220[2] reach V5 and the gate potential of the transistor 202 also reaches V5. Thus, the potential difference between the gate and the source of the transistor 202[2] is approximately equal to the threshold voltage of the transistor 202[2], so that the transistor 202[2] is turned off.

Next, in the period T23, the potential of the wiring 211 is low and the transistor 201[2] is off. As a result, the potential of the node 220[2] is held.

As described above, in the periods T21 to T23, the writing potential (V4) supplied to the wiring 114[2] is supplied to the cell 12[2], so that data is written to the cell 12[2]. Note that in the operation A in FIG. 8, data stored in the cell 11[1,1] is transferred to the cell 12[1] in the periods T21 to T23.

Next, in the period T24, the potential of the wiring 114[2] is low. Note that the potential of the wiring 114[2] is preferably lower than V4. Further, the potential of the wiring 211 is low and the transistor 201[2] is off. As a result, the potential of the node 220[2] is held. The potential of the wiring 213[2] is low. Note that the potential of the wiring 213[2] may be in a floating state.

Next, in the period T25, the potential of the wiring 111[1] is high and the transistor 101[2] is on. As a result, the potential of the wiring 113[2] (low-level potential) is supplied to the node 120[2] through the transistor 101[2], whereby the transistor 102[2] is turned on. Further, the potential of the wiring 112[1] is low.

Then, in the period T26, the potential of the wiring 114[2] is in a floating state. In addition, the potential of the wiring 213[2] is high. At this time, the transistor 202[2] is turned on, and a current (Id) based on the potential (V5) of the gate of the transistor 202[2] and the potential of the wiring 114[2] flows between the source and the drain of the transistor 202[2]. The potential of the wiring 114[2] that is in a floating state approaches the potential of the wiring 213 [2] (high level). Then, the potential of the wiring 114[2] is increased to V4 and the difference between the potential (V5) of the node 220[2] and the potential of the wiring 114[2] is lower than or equal to the threshold voltage of the transistor 202[2]; as a result, the transistor 202[2] is turned off so that the potential of the wiring 114[2] is kept V4.

In the period T26, the potential of the wiring 113[2] is also in a floating state. Here, the wiring 113 [2] and the node 120[2] are connected to the wiring 114[2] through the transistor 102[2]; hence, the potentials of the wiring 113 [2] and the node 120[2] approach the potential V4 of the wiring 114[2]. Specifically, the potentials of the wiring 113[2] and the node 120[2] approach a potential V6, which is lower than the potential V4 of the wiring 114[2]. The difference between the potential V4 and the potential V6 is approximately equal to the threshold voltage of the transistor 102[2]. As the potentials of the wiring 113 [2] and the node 120[2] approach the potential V6, a potential difference between the gate and the source of the transistor 102[2] becomes smaller, reducing the amount of current (Id) flowing between the source and the drain of the transistor 102[2]. Finally, the potentials of the wiring 113[2] and the node 120[2] reach V6 and the gate potential of the transistor 102[2] also reaches V6. Thus, the potential difference between the gate and the source of the transistor 102[2] is approximately equal to the threshold voltage of the transistor 102[2], so that the transistor 102[2] is turned off.

Next, in the period T27, the potential of the wiring 111[1] is low and the transistor 101[2] is off.

Then, in the period T28, the potentials of the wirings 113[2] and 114[2] are low. The potential of the wiring 213[2] is also low. Further, the potential of the wiring 112[1] is high and the potential of the node 120[2] is high, whereby the transistor 102[2] is off. The potential of the wiring 211 is high. Note that the potential of the node 220[2] is low because the node 220[2] is connected to the wiring 213[2] through the transistor 201[2]. Further, the transistor 202[2] is off.

As described above, in the periods T24 to T28, the data stored in the cell 12[2] is written to the cell 11[2]. Note that in the operation A in FIG. 8, data stored in the cell 12[1] is written to the cell 11 [1] in the periods T24 to T28.

Through the above operation, new data can be written to the cell 11[1,2] by supplying a writing potential, while data transfer and rewriting are performed in the cell 11[1,1] so as to retain stored data.

This embodiment can be combined with any of the other embodiments as appropriate.

(Embodiment 3)

In this embodiment, an example of the structure of the semiconductor device 100 illustrated in FIG. 1 will be described more specifically.

<Structure Example of Semiconductor Device>

Figure 9:
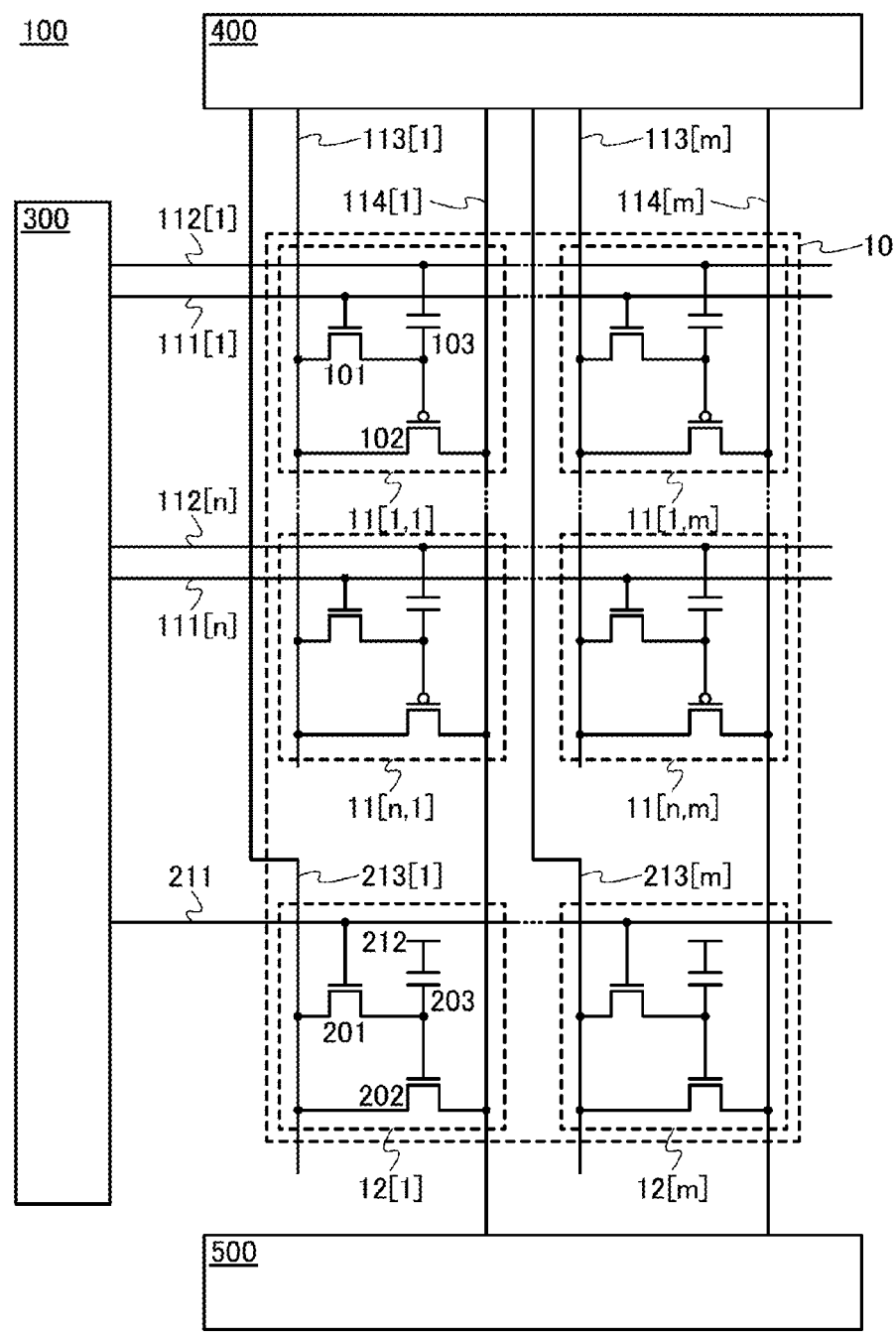
FIG. 9 illustrates an example of a structure of a semiconductor device.

FIG. 9 illustrates an example of the structure of the semiconductor device 100. The semiconductor device 100 includes the cell array 10, a circuit 300, a circuit 400, and a circuit 500. The circuit 300 is connected to the cells 11[1,1] to [n,m] through the wirings 111[1] to [n] or the wirings 112[1] to [n]. The circuit 300 is also connected to the cells 12[1] to [m] through the wiring 211. The circuit 400 is connected to the cells 11[1,1] to [n,m] through the wirings 113[1] to [m]. The circuit 400 is also connected to the cells 11[1,1] to [n,m] and the cells 12[1] to [m] through the wirings 114[1] to [m]. In addition, the circuit 400 is connected to the cells 12[1] to [m] through the wirings 213[1] to [m]. The circuit 500 is connected to the cells 11[1,1] to [n,m] and the cells 12[1] to [m] through the wirings 114[1] to [m].

The cell array 10 includes the n×m cells 11 (cells 11[1,1] to [n,m]) and the 1×m cells 12 (cells 12[1] to [m]). Detailed description of the structure of the cell array 10 is omitted because it is similar to the structure illustrated in FIG. 3.

The circuit 300 has a function of supplying a signal for controlling the conductive state of the transistor 101 to the wirings 111, and a function of supplying a signal for controlling the conductive state of the transistor 201 to the wiring 211. The circuit 300 also has a function of supplying a signal for controlling the gate potential of the transistor 102 to the wiring 112. In the semiconductor device 100, the circuit 300 enables data to be written to and read from the cells 11 in each row.

The circuit 400 has at least one of the functions of setting the wirings 113[1] to [m] and the wirings 114[1] to [m] to a predetermined potential (precharge function), initializing the potentials of the wirings 113[1] to [m] and the wirings 114[1] to [m], and bringing the wirings 113[1] to [m] and the wirings 114[1] to [m] into a floating state. In the semiconductor device 100, the circuit 400 enables data to be written to and read from the cells 11 in each column.

The circuit 500 has a function of converting the potentials of the wirings 114, which are analog values, into digital values and outputting the digital values. The circuit 500 can include, for example, an A/D converter. In the semiconductor device 100, the circuit 500 enables data read from the cells 11 to be output.

Examples of the A/D converter included in the circuit 500 include a flash A/D converter, a successive approximation A/D converter, a multi-slope A/D converter, or a delta-sigma A/D converter.

<Structure Example of Circuit 300>

Figure 10:
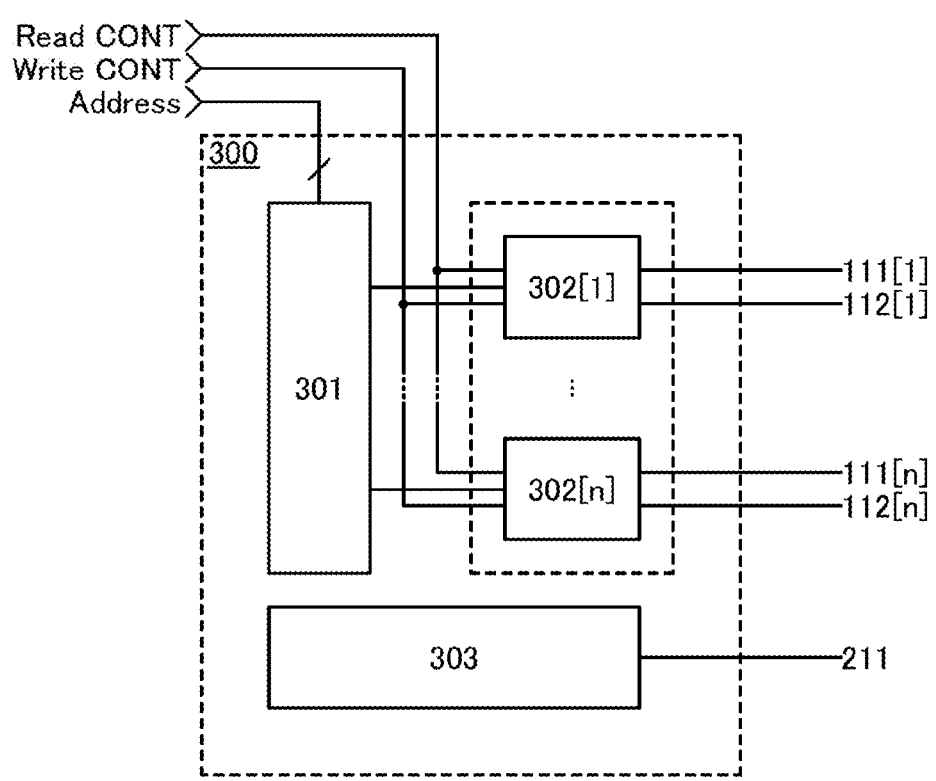
FIG. 10 illustrates an example of a structure of a semiconductor device.

FIG. 10 illustrates an example of a specific structure of the circuit 300.

The circuit 300 includes a circuit 301, a circuit 302, and a circuit 303. The circuit 301 has a function of selecting any of the wirings 111[1] to [n] or any of the wirings 112[1] to [n] in accordance with a signal input from the outside. The circuit 301 can include, for example, a decoder. The circuit 302 has a function of supplying a signal to the one of the wirings 111[1] to [n] and the wirings 112[1] to [n] that is selected by the circuit 301 in accordance with a signal input from the circuit 301 and a signal input from the outside. The circuit 303 is a driver circuit having a function of supplying a signal to the wiring 211.

The number of circuits 302 is the same as that of the wirings 111 and that of the wirings 112 (circuits 302[1] to [n]). One of the circuits 302 is connected to one of the wirings 111 and one of the wirings 112.

<Structure Example of Circuit 400>

Figure 11:
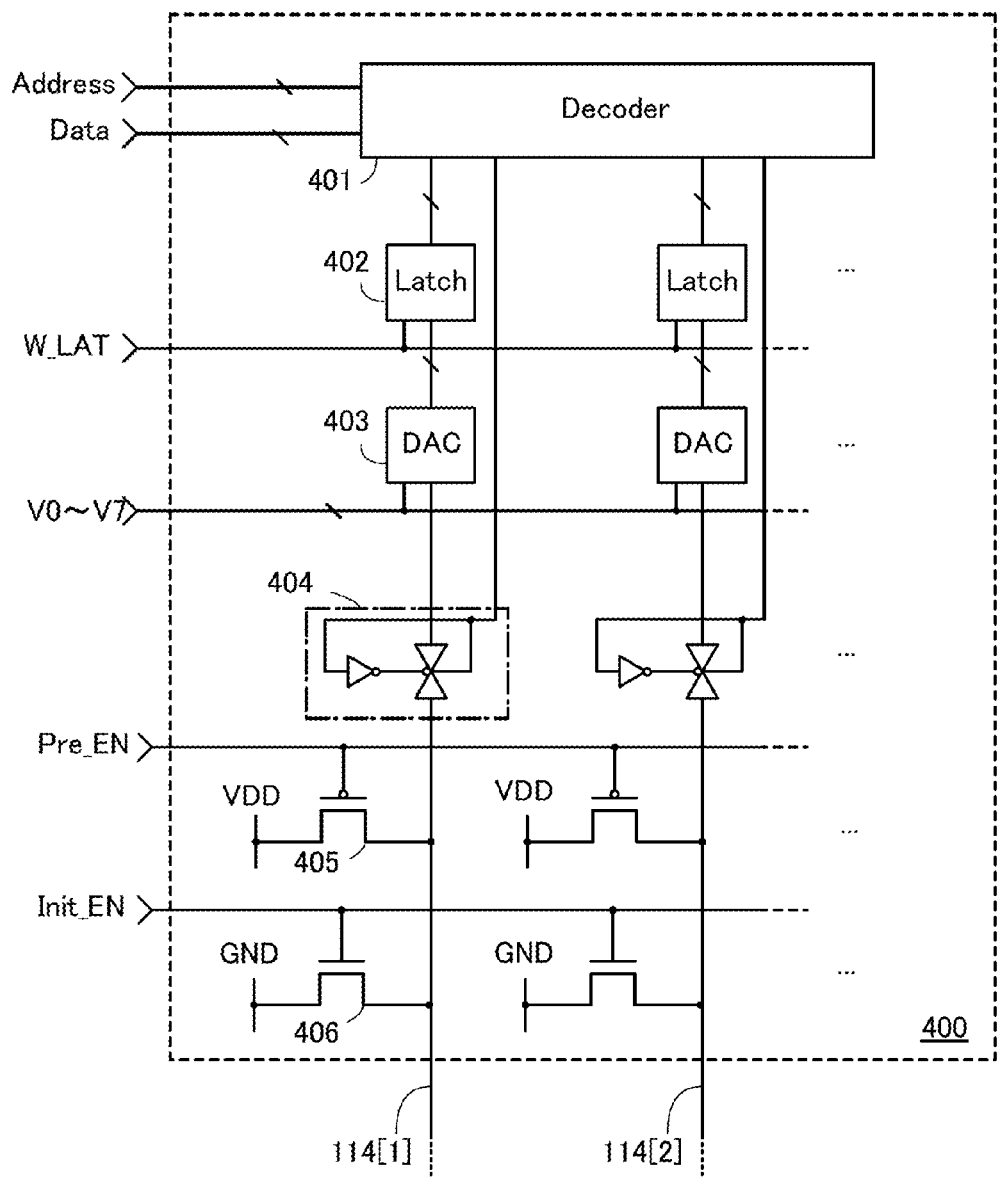
FIG. 11 illustrates an example of a structure of a semiconductor device.

FIG. 11 illustrates an example of a specific structure of the circuit 400.

The circuit 400 illustrated in FIG. 11 includes a decoder 401, a latch circuit 402, a D/A converter 403, a switch circuit 404, a transistor 405, and a transistor 406. These circuits and transistors are provided in each column. The switch circuit 404, the transistor 405, and the transistor 406 in each column are connected to the wiring 114.

The decoder 401 has a function of selecting a column in which the wiring 114 is provided and distributing input data to output the data. Specifically, the decoder 401 receives an address signal (Address) and data (Data) and outputs the data (Data) to the latch circuit 402 in any of columns in accordance with the address signal (Address). In the circuit 400, the decoder 401 enables a predetermined column to be selected so that data is written to the column.

Note that the data (Data) input to the decoder 401 is k-bit digital data. The k-bit digital data is a signal represented by binary data, in which every bit is represented by 1 or 0. For example, 2-bit digital data is represented by 00, 01, 10, or 11.

The latch circuit 402 has a function of temporarily storing the data (Data). For example, the latch circuit 402 is a flip-flop circuit that receives a latch signal W_LAT, stores data in accordance with the latch signal W_LAT, and outputs the data to the D/A converter 403. In the circuit 400, the latch circuit 402 allows data to be written at an opportune time.

The D/A converter 403 has a function of converting the input data (Data), which is digital data, into analog data (Vdata). Specifically, the D/A converter 403 converts, for example, 3-bit data (Data) into one of eight potentials (potentials V0 to V7) and outputs the potential to the switch circuit 404. In the circuit 400, the D/A converter 403 enables a potential corresponding to multilevel data to be written to the cell array 10.

Note that the Vdata output from the D/A converter 403 can be represented by different voltage values. In the case of 2-bit data, the Vdata has four values of, for example, 0.5 V, 1.0 V, 1.5 V, and 2.0 V and can be represented by one of the voltage values.

The switch circuit 404 has a function of supplying the input data (Vdata) to the wiring 114 and bringing the wiring 114 into an electrically floating state. Specifically, the switch circuit 404 includes an analog switch and an inverter and supplies the data (Vdata) to the wiring 114 in accordance with a control signal from the decoder 401. Then, the analog switch is turned off to bring the wiring 114 into an electrically floating state. In the circuit 400, the switch circuit 404 enables the wiring 114 to be maintained in an electrically floating state after being supplied with the data (Vdata).

The transistor 405 has a function of supplying a precharge voltage VDD to the wiring 114 and bringing the wiring 114 into an electrically floating state. Specifically, the transistor 405 is a switch that supplies the precharge voltage VDD to the wiring 114 by control with a precharge control signal Pre_EN and then brings the wiring 114 into an electrically floating state. In the circuit 400, the transistor 405 enables the wiring 114 to be maintained in an electrically floating state after being supplied with the precharge voltage VDD.

The transistor 406 has a function of supplying an initialization voltage GND to the wiring 114. Specifically, the transistor 406 is a switch that supplies the initialization voltage GND to the wiring 114 by control with an initialization control signal Init_EN. In the circuit 400, the transistor 406 enables the initialization voltage GND to be supplied to the wiring 114.

Although not illustrated, the circuit 400 has a function of applying a precharge voltage to the wirings 113 and 213 and bringing the wirings 113 and 213 into an electrically floating state. Such operation can be performed in a manner similar to that for the wiring 114; thus, the description of the wiring 114 is referred to.

<Structure Example of Circuit 500>

Figure 12:
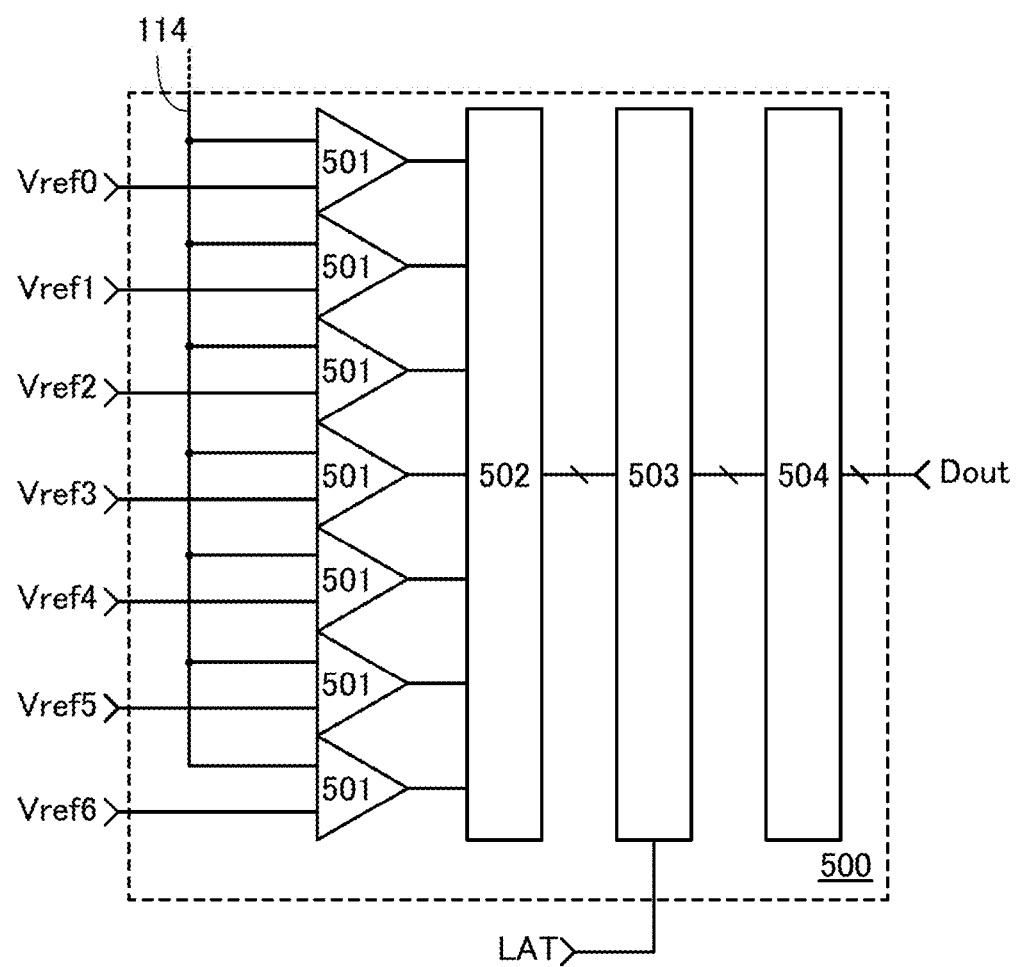
FIG. 12 illustrates an example of a structure of a semiconductor device.

FIG. 12 illustrates an example of a specific structure of the circuit 500.

The circuit 500 illustrated in FIG. 12 includes a plurality of comparators 501, an encoder 502, a latch circuit 503, and a buffer 504. The comparators 501, the encoder 502, the latch circuit 503, and the buffer 504 are provided in each column. The buffer 504 in each column outputs data (Dout).

The comparators 501 have a function of comparing the potential of the wiring 114 with reference voltages Vref0 to Vref6 and determining which of the multilevel data corresponds to the potential of the wiring 114. The potential of the wiring 114 and any of the reference voltages Vref0 to Vref6 are supplied to each of the comparators 501 to determine between which two potentials of the reference voltages Vref0 to Vref6 the potential of the wiring 114 is. With the comparators 501, which of the multilevel data corresponds to the potential of the wiring 114 can be determined in the circuit 500.

Note that the reference voltages Vref0 to Vref6 shown in FIG. 12 as an example have potentials that are supplied when multilevel data is 3-bit data, that is, 8-level data.

The encoder 502 has a function of generating a multi-bit digital signal on the basis of a signal for determining the potential of wiring 114 that is output from the comparators 501. Specifically, the encoder 502 encodes an H-level or L-level signal output from the plurality of comparators 501 to generate a digital signal. With the encoder 502, the circuit 500 can convert data read from the cell array 10 into digital data.

The latch circuit 503 has a function of temporarily storing input digital data. Specifically, the latch circuit 503 is a flip-flop circuit that receives a latch signal LAT, stores data in accordance with the latch signal LAT, and outputs the data to the buffer 504. With the latch circuit 503, the circuit 500 can output data at an opportune time. Note that the latch circuit 503 can be omitted.

The buffer 504 has a function of amplifying data output from the latch circuit 503 and outputting the amplified data as an output signal (Dout). Specifically, the buffer 504 is a circuit provided with an even number of inverter circuits. With the buffer 504, noise of a digital signal can be reduced in the circuit 500. Note that the buffer 504 can be omitted.

As described above, in the semiconductor device 100, the circuits 300, 400, and 500 enable data to be written to and read from the cells 11 and 12.

This embodiment can be combined with any of the other embodiments as appropriate.

(Embodiment 4)

In this embodiment, examples of the specific structure of the cells 11 and 12 will be described.

Figure 13A:
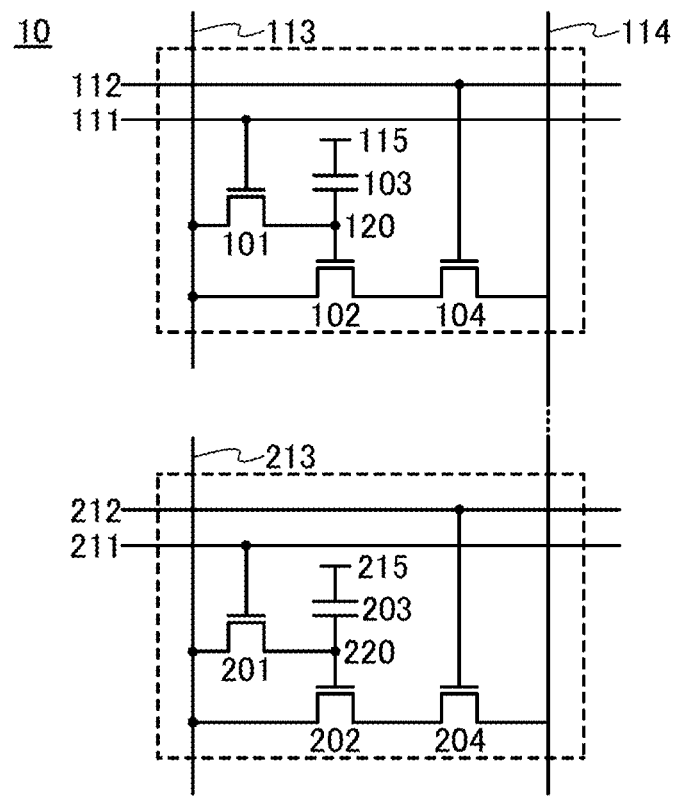
FIGS. 13A and 13B are circuit diagrams each illustrating an example of a structure of a semiconductor device.
Figure 13B:
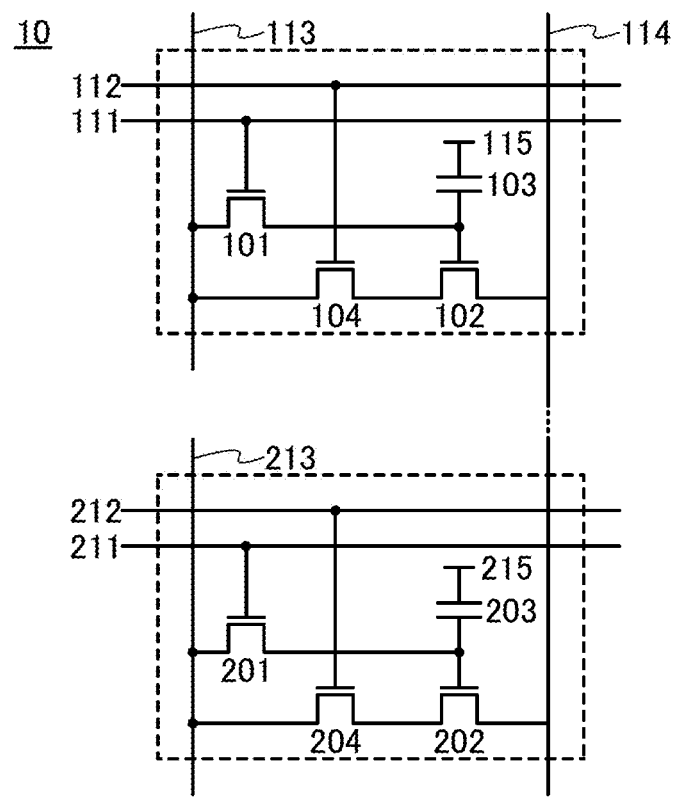

FIG. 2 to FIG. 5 illustrate the structures in which each of the cells 11 and 12 include two transistors; however, each of the cells 11 and 12 may include three or more transistors. FIGS. 13A and 13B each illustrate a structure example in which each of the cells 11 and 12 includes three transistors.

The cell 11 illustrated in FIG. 13A is different from that illustrated in FIG. 2 and FIG. 3 in that a transistor 104 is additionally provided and the other electrode of the capacitor 103 is connected to a wiring 115. The cell 12 illustrated in FIG. 13A is different from that illustrated in FIG. 2 and FIG. 3 in that a transistor 204 is additionally provided and the other electrode of the capacitor 203 is connected to a wiring 215. Note that the wirings 115 and 215 have a function of transmitting a predetermined potential. The wirings 115 and 215 may be a high potential power supply line or a low potential power supply line (such as a ground line). The predetermined potential may be a fixed potential (constant potential) or a varying potential, and is not limited to 0 V.

A gate of the transistor 104 is connected to the wiring 112, one of a source and a drain of the transistor 104 is connected to the other of the source and the drain of the transistor 102, and the other of the source and the drain is connected to the wiring 114. A gate of the transistor 204 is connected to the wiring 212, one of a source and a drain of the transistor 204 is connected to the other of the source and the drain of the transistor 202, and the other of the source and the drain is connected to the wiring 114.

The control of the potential of the wiring 112 allows the control of the conductive state of the transistor 104 and the conductive state between the wiring 113 and the wiring 114. The control of the potential of the wiring 212 allows the control of the conductive state of the transistor 204 and the conductive state between the wiring 213 and the wiring 114. As a result, writing and reading operation in the cells 11 and 12 can be performed more freely.

Note that in FIG. 13A, the transistor 104 is provided between the transistor 102 and the wiring 114, and the transistor 204 is provided between the transistor 202 and the wiring 114. However, there is no particular limitation on the position of the transistors 104 and 204, and the transistors 104 and 204 may each be provided at any position between the wirings, transistors, and capacitor. FIG. 13B illustrates an example in which the transistor 104 is provided between the wiring 113 and the transistor 102, and the transistor 204 is provided between the wiring 213 and the transistor 202. One of the source and the drain of the transistor 104 is connected to the wiring 113 and the other of the source and the drain is connected to the one of the source and the drain of the transistor 102. One of the source and the drain of the transistor 204 is connected to the wiring 213 and the other of the source and the drain is connected to the one of the source and the drain of the transistor 202. Compared with the structure illustrated in FIG. 13A, the structure in FIG. 13B results in a reduction in noise which might be generated in the wiring 114 because of variation in the potentials of the wirings 112 and 212. Accordingly, data can be written and read more properly.

Note that the cells 11 and 12 may have any of the structures illustrated in FIG. 2 to FIG. 5 and FIGS. 13A and 13B. In addition, the cells 11 and the cells 12 may have different structures. For example, the cells 11 each including two transistors illustrated in FIG. 2 to FIG. 5 may be combined with the cells 12 each including three transistors illustrated in FIGS. 13A and 13B. Alternatively, the cells 12 each including two transistors illustrated in FIG. 2 to FIG. 5 may be combined with the cells 11 each including three transistors illustrated in FIGS. 13A and 13B.

This embodiment can be combined with any of the other embodiments as appropriate.

(Embodiment 5)

In this embodiment, the structures of a transistor that can be used in the cell array 10 will be described.

<Example of Cross-Sectional Structure of Semiconductor Device>

Figure 14:
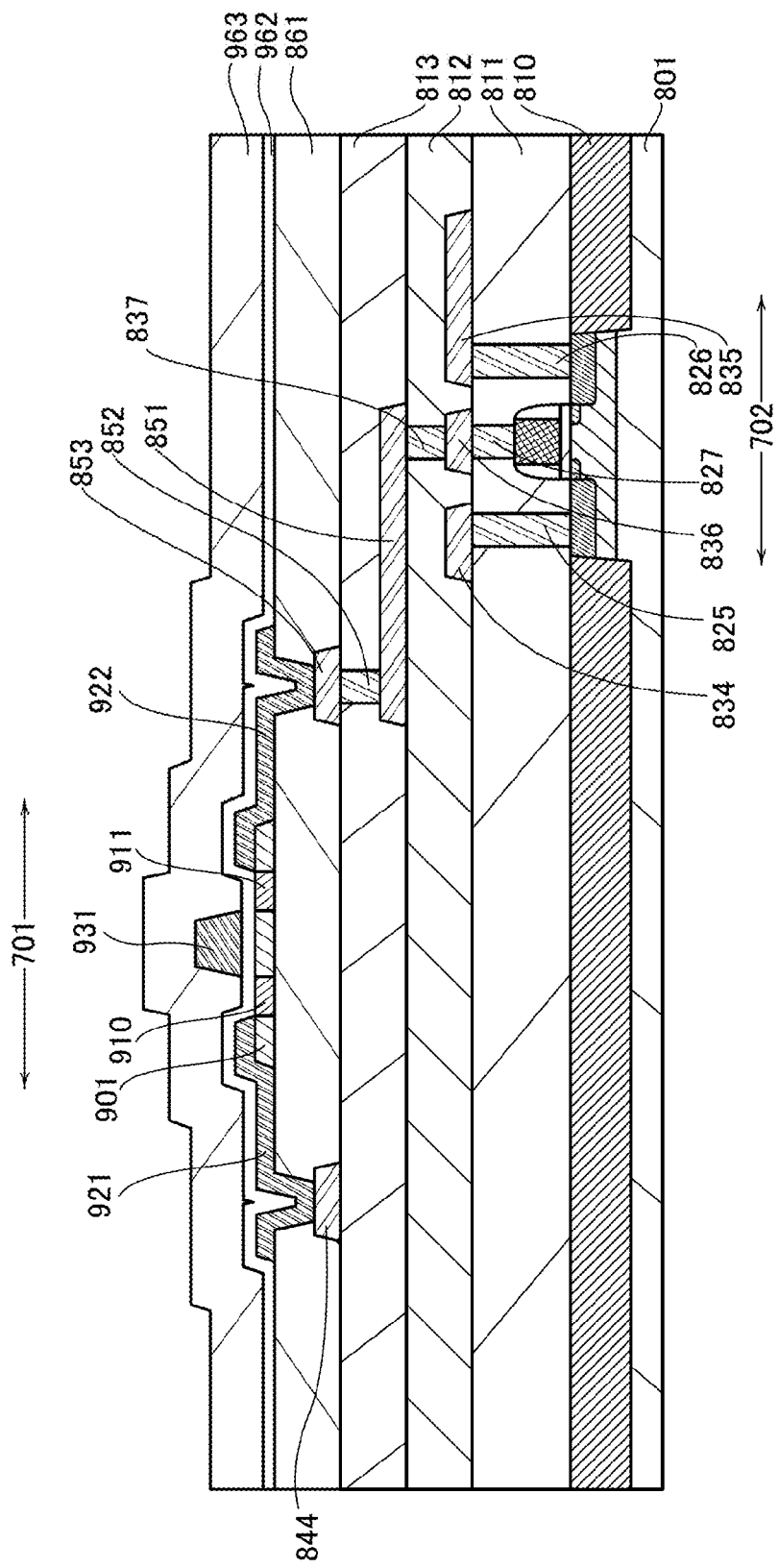
FIG. 14 illustrates an example of a structure of a semiconductor device.

FIG. 14 illustrates an example of the structure of the cells 11 and 12. Note that FIG. 14 illustrates an example in which a transistor 701, an OS transistor, is formed over a transistor 702 whose channel formation region is included in a single-crystal silicon substrate (hereinafter also referred to as Si transistor). This structure in which an OS transistor is stacked over a Si transistor can be used for the cells 11 and 12 as appropriate. For example, the transistors 102, 104, 202, and 204 in FIG. 2 to FIG. 5, FIGS. 13A and 13B, and the like are formed as Si transistors on a single-crystal silicon substrate like the transistor 702 in FIG. 14, and the transistors 101 and 201 in FIG. 2 to FIG. 5, FIGS. 13A and 13B, and the like are formed as OS transistors like the transistor 701 in FIG. 14 and stacked over the transistors on the single-crystal silicon substrate.

The transistor 702 may include the channel formation region in a semiconductor film or a semiconductor substrate of silicon, germanium, or the like in an amorphous, microcrystalline, polycrystalline, or single crystal state. Alternatively, the transistor 702 may include the channel formation region in an oxide semiconductor film or an oxide semiconductor substrate. In the case where the transistors each include a channel formation region in an oxide semiconductor film or an oxide semiconductor substrate, the transistor 701 is not necessarily stacked over the transistor 702, and the transistors 701 and 702 may be formed in the same layer.

In the case where the transistor 702 is formed using a thin silicon film, any of the following can be used in the thin film: amorphous silicon formed by a sputtering method or a vapor phase growth method such as a plasma-enhanced chemical vapor deposition (CVD) method; polycrystalline silicon obtained by crystallization of amorphous silicon by treatment such as laser annealing; single crystal silicon obtained by separation of a surface portion of a single crystal silicon wafer by implantation of hydrogen ions or the like into the silicon wafer; and the like.

A semiconductor substrate 801 where the transistor 702 is formed can be, for example, a silicon substrate, a germanium substrate, or a silicon germanium substrate. In FIG. 14, a single crystal silicon substrate is used as the semiconductor substrate 801.

The transistor 702 is electrically isolated by an element isolation method. As the element isolation method, a selective oxidation method (a local oxidation of silicon (LOCOS) method), a trench isolation method (a shallow trench isolation (STI) method), or the like can be used. FIG. 14 illustrates an example where the trench isolation method is used to electrically isolate the transistor 702. Specifically, in FIG. 14, an element isolation region 810 is formed in such a manner that an insulator including silicon oxide or the like is buried in a trench formed in the semiconductor substrate 801 by etching or the like, so that the transistor 702 is electrically isolated by element isolation.

An insulating film 811 is provided over the transistor 702. Openings are formed in the insulating film 811. Conductive films 825 and 826 that are electrically connected to the source and the drain of the transistor 702 and a conductive film 827 that is electrically connected to the gate of the transistor 702 are formed in the openings.

The conductive film 825 is electrically connected to a conductive film 834 formed over the insulating film 811. The conductive film 826 is electrically connected to a conductive film 835 formed over the insulating film 811. The conductive film 827 is electrically connected to a conductive film 836 formed over the insulating film 811.

An insulating film 812 is formed over the conductive films 834 to 836. An opening is formed in the insulating film 812. A conductive film 837 electrically connected to the conductive film 836 is formed in the opening. The conductive film 837 is electrically connected to a conductive film 851 formed over the insulating film 812.

An insulating film 813 is formed over the conductive film 851. An opening is formed in the insulating film 813. A conductive film 852 electrically connected to the conductive film 851 is formed in the opening. The conductive film 852 is electrically connected to a conductive film 853 formed over the insulating film 813. A conductive film 844 is formed over the insulating film 813.

An insulating film 861 is formed over the conductive film 853 and the conductive film 844. In FIG. 14, the transistor 701 is formed over the insulating film 861.

The transistor 701 includes, over the insulating film 861, a semiconductor film 901 including an oxide semiconductor, conductive films 921 and 922 functioning as a source and a drain over the semiconductor film 901, a gate insulating film 962 over the semiconductor film 901 and the conductive films 921 and 922, and a gate electrode 931 which is over the gate insulating film 962 and overlaps with the semiconductor film 901 between the conductive films 921 and 922. Note that the conductive film 922 is electrically connected to the conductive film 853 in the opening formed in the insulating film 861.

In the semiconductor film 901 of the transistor 701, there is a region 910 between a region overlapping with the conductive film 921 and a region overlapping with the gate electrode 931. In addition, in the semiconductor film 901 of the transistor 701, there is a region 911 between a region overlapping with the conductive film 922 and the region overlapping with the gate electrode 931. When argon, an impurity which imparts p-type conductivity to the semiconductor film 901, or an impurity which imparts n-type conductivity to the semiconductor film 901 is added to the regions 910 and 911 using the conductive films 921 and 922 and the gate electrode 931 as a mask, the resistivity of the regions 910 and 911 can be made lower than that of the region overlapping with the gate electrode 931 in the semiconductor film 901.

An insulating film 963 is provided over the transistor 701.

In FIG. 14, the transistor 701 has the gate electrode 931 on at least one side of the semiconductor film 901; alternatively, the transistor 701 may have a pair of gate electrodes with the semiconductor film 901 positioned therebetween.

In the case where the transistor 701 has a pair of gate electrodes with the semiconductor film 901 positioned therebetween, one of the gate electrodes may be supplied with a signal for controlling the on/off state, and the other of the gate electrodes may be supplied with a potential from another element. In this case, potentials with the same level may be supplied to the pair of gate electrodes, or a fixed potential such as the ground potential may be supplied only to the other of the gate electrodes. By controlling the level of a potential supplied to the other of the gate electrodes, the threshold voltage of the transistor can be controlled.

In FIG. 14, the transistor 701 has a single-gate structure including one channel formation region corresponding to one gate electrode 931. However, the transistor 701 may have a multi-gate structure where a plurality of electrically connected gate electrodes are provided so that a plurality of channel formation regions are included in one active layer.
<Transistor>

Then, structure examples of the OS transistor will be described.

Figure 15A:
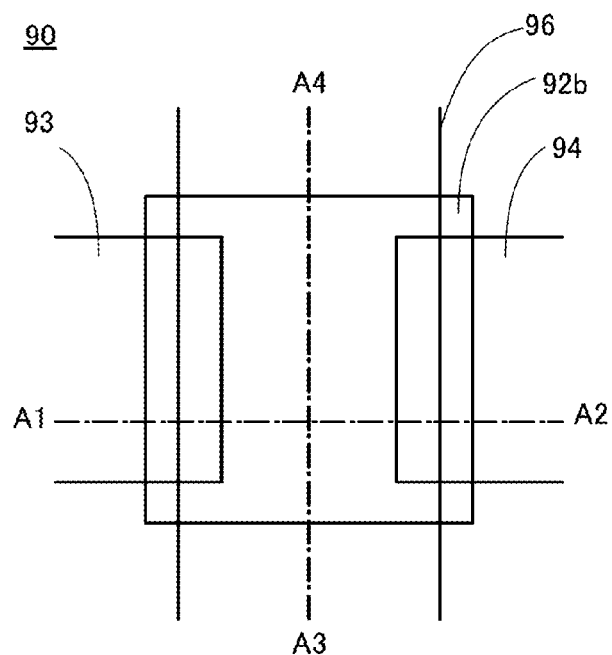
FIGS. 15A to 15C illustrate an example of a structure of a transistor.
Figure 15C:
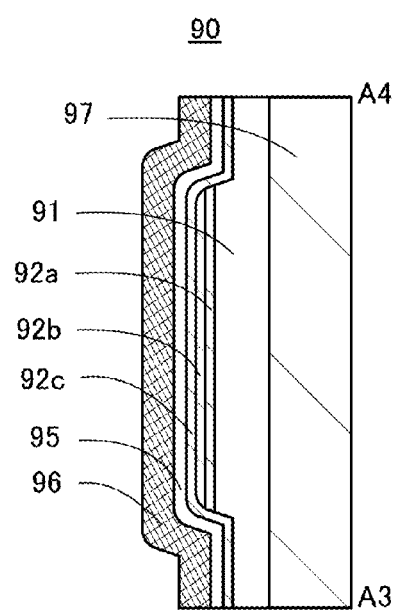
Figure 15B:
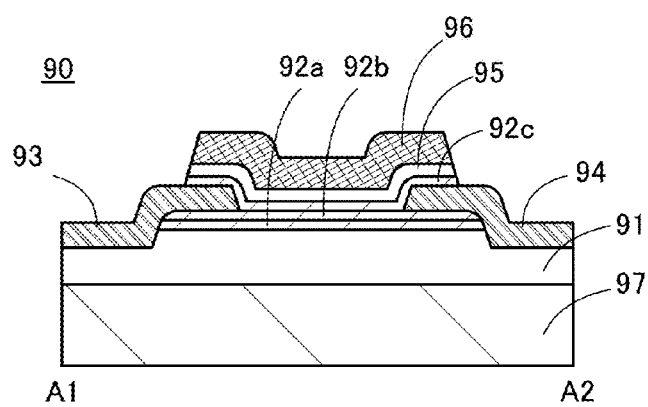

FIGS. 15A to 15C illustrate a structure of the transistor 90 that includes a channel formation region in an oxide semiconductor film as an example. FIG. 15A is a top view of the transistor 90. Note that insulating films are not illustrated in FIG. 15A in order to clarify the layout of the transistor 90. FIG. 15B is a cross-sectional view along dashed-dotted line A1-A2 in the top view in FIG. 15A. FIG. 15C is a cross-sectional view along dashed-dotted line A3-A4 in the top view in FIG. 15A.

As illustrated in FIGS. 15A to 15C, the transistor 90 includes an oxide semiconductor film 92a and an oxide semiconductor film 92b that are stacked in this order over an insulating film 91 formed over a substrate 97; a conductive film 93 and a conductive film 94 that are electrically connected to the oxide semiconductor film 92b and function as a source electrode and a drain electrode; an oxide semiconductor film 92c over the oxide semiconductor film 92b, the conductive film 93, and the conductive film 94; an insulating film 95 that functions as a gate insulating film and is located over the oxide semiconductor film 92c; and a conductive film 96 that functions as a gate electrode, lies over the insulating film 95, and overlaps with the oxide semiconductor films 92a to 92c. Note that the substrate 97 may be a glass substrate, a semiconductor substrate, or the like or may be an element substrate where semiconductor elements are formed over a glass substrate or on a semiconductor substrate.

Figure 16A:
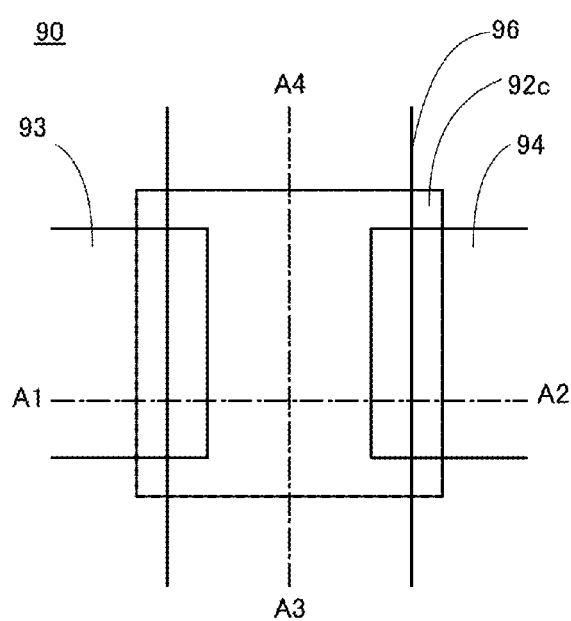
FIGS. 16A to 16C illustrate an example of a structure of a transistor.
Figure 16C:
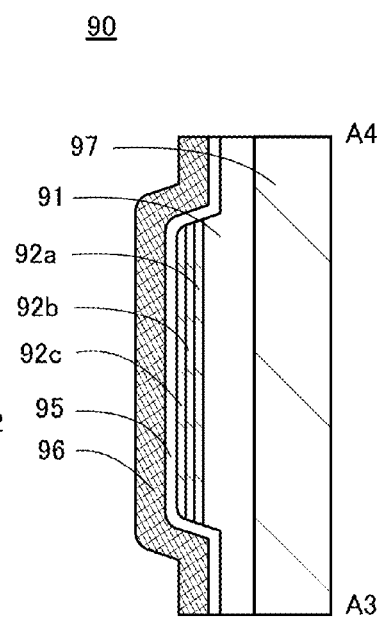
Figure 16B:
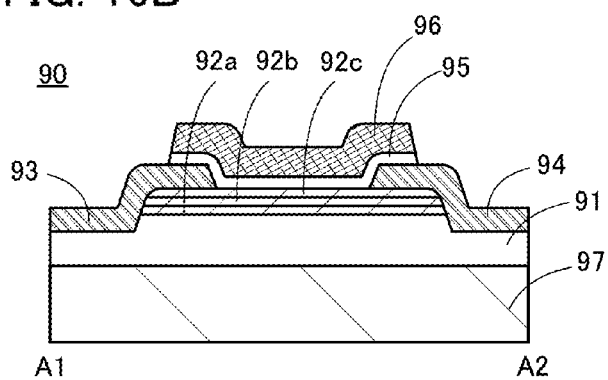

FIGS. 16A to 16C illustrate another specific example of the structure of the transistor 90. FIG. 16A is a top view of the transistor 90. Note that insulating films are not illustrated in FIG. 16A in order to clarify the layout of the transistor 90. FIG. 16B is a cross-sectional view along dashed-dotted line A1-A2 in the top view in FIG. 16A. FIG. 16C is a cross-sectional view along dashed-dotted line A3-A4 in the top view in FIG. 16A.

As illustrated in FIGS. 16A to 16C, the transistor 90 includes the oxide semiconductor films 92a to 92c that are stacked in this order over the insulating film 91; the conductive films 93 and 94 that are electrically connected to the oxide semiconductor film 92c and function as a source electrode and a drain electrode; the insulating film 95 that functions as a gate insulating film and is located over the oxide semiconductor film 92c and the conductive films 93 and 94; and the conductive film 96 that functions as a gate electrode, lies over the insulating film 95, and overlaps with the oxide semiconductor films 92a to 92c.

FIGS. 15A to 15C and FIGS. 16A to 16C each illustrate the structure example of the transistor 90 in which the oxide semiconductor films 92a to 92c are stacked. However, the structure of the oxide semiconductor film included in the transistor 90 is not limited to a stacked-layer structure including a plurality of oxide semiconductor films and may be a single-layer structure.

In the case where the transistor 90 includes the semiconductor film in which the oxide semiconductor films 92a to 92c are stacked in this order, each of the oxide semiconductor films 92a and 92c is an oxide film that contains at least one of metal elements contained in the oxide semiconductor film 92b and in which energy at the conduction band minimum is closer to the vacuum level than that in the oxide semiconductor film 92b by higher than or equal to 0.05 eV, 0.07 eV, 0.1 eV, or 0.15 eV and lower than or equal to 2 eV, 1 eV, 0.5 eV, or 0.4 eV. The oxide semiconductor film 92b preferably contains at least indium because carrier mobility is increased.

In the case where the transistor 90 includes the semiconductor films with the above structure, when an electric field is applied to the semiconductor films by applying voltage to the gate electrode, a channel region is formed in the oxide semiconductor film 92b, which has the lowest conduction band minimum among the semiconductor films. That is, since the oxide semiconductor film 92c is provided between the oxide semiconductor film 92b and the insulating film 95, a channel region can be formed in the oxide semiconductor film 92b, which is separated from the insulating film 95.

Since the oxide semiconductor film 92c contains at least one of metal elements contained in the oxide semiconductor film 92b, interface scattering is unlikely to occur at the interface between the oxide semiconductor film 92b and the oxide semiconductor film 92c. Thus, the movement of carriers is unlikely to be inhibited at the interface, which results in an increase in the field-effect mobility of the transistor 90.

When an interface state is formed at the interface between the oxide semiconductor films 92b and 92a, a channel region is formed also in a region close to the interface, which varies the threshold voltage of the transistor 90. However, since the oxide semiconductor film 92a contains at least one of metal elements contained in the oxide semiconductor film 92b, an interface state is unlikely to be formed at the interface between the oxide semiconductor films 92b and 92a. Accordingly, the above structure can reduce variations in the electrical characteristics of the transistor 90, such as the threshold voltage.

Further, it is preferable that a plurality of oxide semiconductor films be stacked so that an interface state due to an impurity existing between the oxide semiconductor films, which inhibits carrier flow, is not formed at an interface between the oxide semiconductor films. This is because when an impurity exists between the stacked oxide semiconductor films, the energy continuity of the conduction band minimum between the oxide semiconductor films is lost, and carriers are trapped or disappear by recombination in the vicinity of the interface. By reducing an impurity existing between the films, a continuous junction (here, in particular, a well structure having a U shape in which the conduction band minimum is changed continuously between the films) is formed easily as compared with the case of merely stacking the plurality of oxide semiconductor films which contain at least one common metal as a main component.

In order to form such a continuous junction, it is necessary to form films continuously without being exposed to air, with use of a multi-chamber deposition apparatus (sputtering apparatus) including a load lock chamber. Each chamber in the sputtering apparatus is preferably subjected to high vacuum evacuation (to a vacuum of about $5 \times 10^{-7}$ Pa to $1 \times 10^{-4}$ Pa) with use of a suction vacuum evacuation pump such as a cryopump so that water or the like, which is an impurity for an oxide semiconductor, is removed as much as possible. Alternatively, a turbo molecular pump and a cold trap are preferably used in combination to prevent backflow of gas into the chamber through an evacuation system.

To obtain a highly purified intrinsic oxide semiconductor, not only high vacuum evacuation of the chambers but also high purification of a gas used in the sputtering is important. When an oxygen gas or an argon gas used as the above gas has a dew point of −40° C. or lower, preferably −80° C. or lower, further preferably −100° C. or lower and is highly purified, moisture and the like can be prevented from entering the oxide semiconductor film as much as possible. Specifically, in the case where the oxide semiconductor film 92b is an In-M-Zn oxide film (M represents Ga, Y, Zr, La, Ce, or Nd) and a target having the atomic ratio of metal elements of In:M:Zn=$x_1$:$y_1$:$z_1$ is used for forming the oxide semiconductor film 92b, $x_1$/$y_1$ is preferably greater than or equal to 1/3 and less than or equal to 6, further preferably greater than or equal to 1 and less than or equal to 6, and $z_1$/$y_1$ is preferably greater than or equal to 1/3 and less than or equal to 6, further preferably greater than or equal to 1 and less than or equal to 6. Note that when $z_1$/$y_1$ is greater than or equal to 1 and less than or equal to 6, a c-axis aligned crystalline oxide semiconductor (CAAC-OS) film as the oxide semiconductor film 92b is easily formed. Typical examples of the atomic ratio of the metal elements of the target are In:M:Zn=1:1:1 and In:M:Zn=3:1:2. Note that the CAAC-OS will be described in detail later.

Specifically, in the case where the oxide semiconductor film 92a and the oxide semiconductor film 92c are an In-M-Zn oxide film (M represents Ga, Y, Zr, La, Ce, or Nd) and a target having the atomic ratio of metal elements of In:M:Zn=$x_2$:$y_2$:$z_2$ is used for forming the oxide semiconductor films 92a and 92c, $x_2$/$y_2$ is preferably less than $x_1$/$y_1$, and $z_2$/$y_2$ is preferably greater than or equal to 1/3 and less than or equal to 6, further preferably greater than or equal to 1 and less than or equal to 6. Note that when $z_2$/$y_2$ is greater than or equal to 1 and less than or equal to 6, CAAC-OS films are easily formed as the oxide semiconductor films 92a and 92c. Typical examples of the atomic ratio of the metal elements of the target are In:M:Zn=1:3:2, In:M:Zn=1:3:4, In:M:Zn=1:3:6, and In:M:Zn=1:3:8.

The oxide semiconductor film 92a and the oxide semiconductor film 92c each have a thickness of more than or equal to 3 nm and less than or equal to 100 nm, preferably more than or equal to 3 nm and less than or equal to 50 nm. The thickness of the oxide semiconductor film 92b is more than or equal to 3 nm and less than or equal to 200 nm, preferably more than or equal to 3 nm and less than or equal to 100 nm, further preferably more than or equal to 3 nm and less than or equal to 50 nm.

In the three-layer semiconductor film, the three oxide semiconductor films 92a to 92c can be either amorphous or crystalline. Note that the oxide semiconductor film 92b in which a channel region is formed preferably has a crystalline structure, in which case the transistor 90 can have stable electrical characteristics.

Note that a channel formation region refers to a region of a semiconductor film of the transistor 90 that overlaps with a gate electrode and is between a source electrode and a drain electrode. A channel region refers to a region through which current mainly flows in the channel formation region.

For example, when an In—Ga—Zn oxide film formed by a sputtering method is used as each of the oxide semiconductor films 92a and 92c, the oxide semiconductor films 92a and 92c can be deposited with the use of an In—Ga—Zn oxide target containing In, Ga, and Zn in an atomic ratio of 1:3:2. The deposition conditions can be as follows: an argon gas (flow rate: 30 sccm) and an oxygen gas (flow rate: 15 sccm) are used as the deposition gas; the pressure is 0.4 Pa; the substrate temperature is 200° C.; and the DC power is 0.5 kW.

Further, when the oxide semiconductor film 92b is a CAAC-OS film, the oxide semiconductor film 92b is preferably deposited with the use of a target containing a polycrystalline In—Ga—Zn oxide (In:Ga:Zn=1:1:1 [atomic ratio]). The deposition conditions can be as follows: an argon gas (flow rate: 30 sccm) and an oxygen gas (flow rate: 15 sccm) are used as the deposition gas; the pressure is 0.4 Pa; the substrate temperature is 300° C.; and the DC power is 0.5 kW. When the oxide semiconductor film 92b is a CAAC-OS film, the oxide semiconductor film 92b may be deposited with the use of an In—Ga—Zn oxide target containing In, Ga, and Zn in an atomic ratio of 2:1:3. In the CAAC-OS film deposited with the use of the target, the proportion of a region where a diffraction pattern of the CAAC-OS film is observed in a predetermined area (also referred to as proportion of CAAC) can be high. As a result, the frequency characteristics of a transistor including a channel formation region in the CAAC-OS film can be high.

Note that the oxide semiconductor films 92a to 92c can be formed by a sputtering method.

There are few carrier generation sources in a highly purified oxide semiconductor (purified oxide semiconductor) obtained by reduction of impurities such as moisture and hydrogen serving as electron donors (donors) and reduction of oxygen vacancies; therefore, the highly purified oxide semiconductor can be an intrinsic (i-type) semiconductor or a substantially i-type semiconductor. For this reason, a transistor having a channel formation region in a highly purified oxide semiconductor film has an extremely low off-state current and high reliability. Thus, a transistor in which a channel formation region is formed in the oxide semiconductor film easily has an electrical characteristic of a positive threshold voltage (also referred to as a normally-off characteristic).

Specifically, various experiments can prove a low off-state current of a transistor having a channel formation region in a highly purified oxide semiconductor film. For example, even when an element has a channel width of $1 \times 10^6$ μm and a channel length of 10 μm, off-state current can be less than or equal to the measurement limit of a semiconductor parameter analyzer, i.e., less than or equal to $1 \times 10^{13}$ A, at a voltage (drain voltage) between the source electrode and the drain electrode of from 1 V to 10 V. In that case, it can be seen that the off-state current of the transistor normalized on the channel width is lower than or equal to 100 zA/μm. In addition, a capacitor and a transistor were connected to each other and off-state current was measured using a circuit in which charges flowing to or from the capacitor are controlled by the transistor. In the measurement, a highly purified oxide semiconductor film was used for a channel formation region of the transistor, and the off-state current of the transistor was measured from a change in the amount of charge of the capacitor per unit time. As a result, it was found that, in the case where the voltage between the source electrode and the drain electrode of the transistor is 3 V, a lower off-state current of several tens of yoctoamperes per micrometer (yA/μm) is obtained. Accordingly, the transistor including a channel formation region in the highly purified oxide semiconductor film has much lower off-state current than a crystalline silicon transistor.

In the case where an oxide semiconductor film is used as the semiconductor film, at least indium (In) or zinc (Zn) is preferably included as an oxide semiconductor. In addition, as a stabilizer for reducing variations in electrical characteristics among transistors formed using such an oxide semiconductor, gallium (Ga) is preferably contained in addition to In and Zn. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

Among oxide semiconductors, unlike silicon carbide, gallium nitride, or gallium oxide, an In—Ga—Zn oxide, an In—Sn—Zn oxide, or the like has an advantage of high mass productivity because a transistor with favorable electrical characteristics can be formed by a sputtering method or a wet process. Further, unlike silicon carbide, gallium nitride, or gallium oxide, with the use of the In—Ga—Zn oxide, a transistor with favorable electrical characteristics can be formed over a glass substrate. Further, a larger substrate can be used.

As another stabilizer, one or more lanthanoids selected from lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor, any of the following oxides can be used, for example: indium oxide, gallium oxide, tin oxide, zinc oxide, an In—Zn oxide, an Sn—Zn oxide, an Al—Zn oxide, a Zn—Mg oxide, an Sn—Mg oxide, an In—Mg oxide, an In—Ga oxide, an In—Ga—Zn oxide (also referred to as IGZO), an In—Al—Zn oxide, an In—Sn—Zn oxide, an Sn—Ga—Zn oxide, an Al—Ga—Zn oxide, an Sn—Al—Zn oxide, an In—Hf—Zn oxide, an In—La—Zn oxide, an In—Pr—Zn oxide, an In—Nd—Zn oxide, an In—Ce—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, and an In—Hf—Al—Zn oxide.

For example, an In—Ga—Zn oxide refers to an oxide containing In, Ga, and Zn, and there is no limitation on the ratio of In to Ga and Zn. Further, the In—Ga—Zn oxide may contain a metal element other than In, Ga, and Zn. The In—Ga—Zn oxide has sufficiently high resistance when no electric field is applied thereto, so that off-state current can be sufficiently reduced. Moreover, the In—Ga—Zn oxide has high mobility.

For example, high mobility can be obtained relatively easily in the case of using an In—Sn—Zn oxide. Meanwhile, when an In—Ga—Zn oxide is used, the mobility can be increased by reducing the defect density in a bulk.

In the transistor 90, a metal in the source and drain electrodes might extract oxygen from the oxide semiconductor film depending on a conductive material used for the source and drain electrodes. In such a case, oxygen vacancies are generated in a region of the oxide semiconductor film that is in contact with the source electrode or the drain electrode, and hydrogen contained in the oxide semiconductor film enters into the oxygen vacancies, whereby the region is changed to an n-type region. The n-type region serves as a source region or a drain region, resulting in a decrease in the contact resistance between the oxide semiconductor film and the source electrode or the drain electrode. Accordingly, the formation of the n-type region increases the mobility and on-state current of the transistor 90, achieving the high-speed operation of a semiconductor device using the transistor 90.

Note that the extraction of oxygen by a metal in the source electrode and the drain electrode is probably caused when the source electrode and the drain electrode are formed by a sputtering method or when heat treatment is performed after the formation of the source electrode and the drain electrode. The n-type region is more likely to be formed by forming the source electrode and the drain electrode with use of a conductive material that is easily bonded to oxygen. Examples of such a conductive material include Al, Cr, Cu, Ta, Ti, Mo, and W.

In the case where the semiconductor film including the stacked oxide semiconductor films is used in the transistor 90, the n-type region preferably extends to the oxide semiconductor film 92b serving as a channel region in order that the mobility and on-state current of the transistor 90 can be further increased and the semiconductor device can operate at higher speed.

The insulating film 91 preferably has a function of supplying part of oxygen to the oxide semiconductor films 92a to 92c by heating. It is preferable that the number of defects in the insulating film 91 be small, and typical spin density at g=2.001 due to a dangling bond of silicon be lower than or equal to $1 \times 10^{18}$ spins/cm$^3$. The spin density is measured by electron spin resonance (ESR) spectroscopy.

The insulating film 91, which has a function of supplying part of oxygen to the oxide semiconductor films 92a to 92c by heating, is preferably an oxide. Examples of the oxide include aluminum oxide, magnesium oxide, silicon oxide, silicon oxynitride, silicon nitride oxide, gallium oxide, germanium oxide, yttrium oxide, zirconium oxide, lanthanum oxide, neodymium oxide, hafnium oxide, and tantalum oxide. The insulating film 91 can be formed by a plasma CVD method, a sputtering method, or the like.

Note that in this specification, oxynitride contains more oxygen than nitrogen, and nitride oxide contains more nitrogen than oxygen.

Note that in the transistor 90 illustrated in FIGS. 15A to 15C and FIGS. 16A to 16C, the conductive film 96 overlaps with end portions of the oxide semiconductor film 92b including a channel region that do not overlap with the conductive films 93 and 94, i.e., end portions of the oxide semiconductor film 92b that are in a region different from a region where the conductive films 93 and 94 are located. When the end portions of the oxide semiconductor film 92b are exposed to plasma by etching for forming the end portions, a chlorine radical, a fluorine radical, or other radicals generated from an etching gas are easily bonded to a metal element contained in an oxide semiconductor. For this reason, in the end portions of the oxide semiconductor film, oxygen bonded to the metal element is easily released, so that an oxygen vacancy is easily formed; thus, the end portions of the oxide semiconductor film easily have n-type conductivity. However, an electric field applied to the end portions can be controlled by controlling the potential of the conductive film 96 because the end portions of the oxide semiconductor film 92b that do not overlap with the conductive films 93 and 94 overlap with the conductive film 96 in the transistor 90 illustrated in FIGS. 15A to 15C and FIGS. 16A to 16C. Consequently, current that flows between the conductive films 93 and 94 through the end portions of the oxide semiconductor film 92b can be controlled by the potential applied to the conductive film 96. Such a structure of the transistor 90 is referred to as a surrounded channel (s-channel) structure.

With the s-channel structure, specifically, when a potential at which the transistor 90 is turned off is supplied to the conductive film 96, the amount of off-state current that flows between the conductive films 93 and 94 through the end portions can be reduced. For this reason, in the transistor 90, even when the distance between the conductive films 93 and 94 at the end portions of the oxide semiconductor film 92*b* is reduced as a result of reducing the channel length to obtain high on-state current, the transistor 90 can have a low off-state current. Consequently, with the short channel length, the transistor 90 can have a high on-state current when in an on state and a low off-state current when in an off state.

With the s-channel structure, specifically, when a potential at which the transistor 90 is turned on is supplied to the conductive film 96, the amount of current that flows between the conductive films 93 and 94 through the end portions of the oxide semiconductor film 92*b* can be increased. The current contributes to an increase in the field-effect mobility and an increase in the on-state current of the transistor 90. When the end portions of the oxide semiconductor film 92*b* overlap with the conductive film 96, carriers flow in a wide region of the oxide semiconductor film 92*b* without being limited to a region in the vicinity of the interface between the oxide semiconductor film 92*b* and the insulating film 95, which results in an increase in the amount of carrier movement in the transistor 90. As a result, the on-state current of the transistor 90 is increased, and the field-effect mobility is increased to greater than or equal to 10 cm$^2$/V·s or to greater than or equal to 20 cm$^2$/V·s, for example. Note that here, the field-effect mobility is not an approximate value of the mobility as the physical property of the oxide semiconductor film but is the apparent field-effect mobility in a saturation region of the transistor, which is an index of current drive capability.

<Structure of Oxide Semiconductor Film>

A structure of an oxide semiconductor film will be described below. Note that in the following description, the term "parallel" indicates that the angle formed between two straight lines is greater than or equal to −10° and less than or equal to 10°, and accordingly also includes the case where the angle is greater than or equal to −5° and less than or equal to 5°. The term "perpendicular" indicates that the angle formed between two straight lines is greater than or equal to 80° and less than or equal to 100°, and accordingly also includes the case where the angle is greater than or equal to 85° and less than or equal to 95°. Further, the trigonal and rhombohedral crystal systems are included in the hexagonal crystal system.

An oxide semiconductor film is classified roughly into a single-crystal oxide semiconductor film and a non-single-crystal oxide semiconductor film. The non-single-crystal oxide semiconductor film includes any of a CAAC-OS film, a polycrystalline oxide semiconductor film, a microcrystalline oxide semiconductor film, an amorphous oxide semiconductor film, and the like.

[CAAC-OS Film]

First, a CAAC-OS film is described.

The CAAC-OS film is one of oxide semiconductor films having a plurality of c-axis aligned crystal parts.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer reflects unevenness of a surface over which the CAAC-OS film is formed (hereinafter, such a surface is referred to as a formation surface) or a top surface of the CAAC-OS film, and is arranged parallel to the formation surface or the top surface of the CAAC-OS film.

In contrast, according to the TEM image of the CAAC-OS film observed in a direction substantially perpendicular to the sample surface (plan-view TEM image), metal atoms are arranged in a triangular or hexagonal configuration in the crystal parts. However, there is no regularity of arrangement of metal atoms between different crystal parts.

Figure 19A:
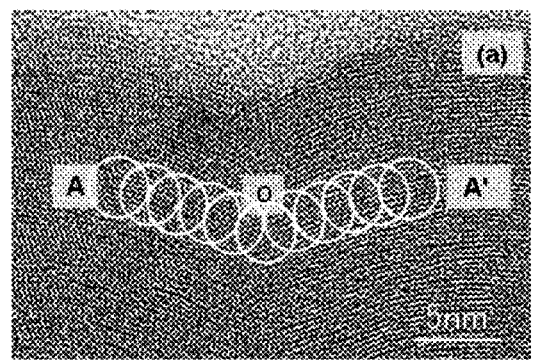
FIGS. 19A to 19C illustrate an example of a structure of an oxide semiconductor.
Figure 19B:
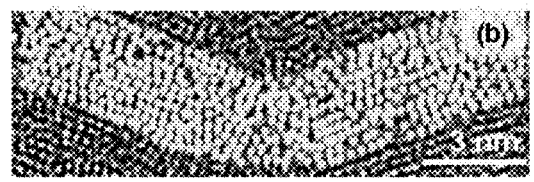

FIG. 19A is a cross-sectional TEM image of a CAAC-OS film. FIG. 19B is a cross-sectional TEM image obtained by enlarging the image of FIG. 19A. In FIG. 19B, atomic arrangement is highlighted for easy understanding.

Figure 19C:
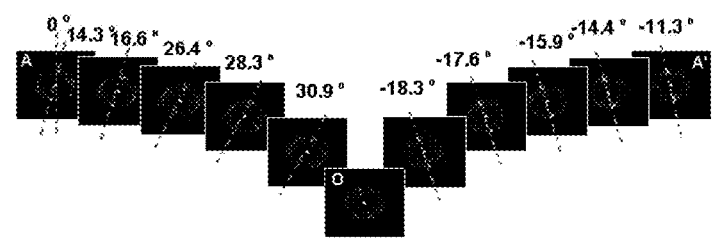

FIG. 19C is Fourier transform images of regions each surrounded by a circle (the diameter is approximately 4 nm) between A and O and between O and A' in FIG. 19A. C-axis alignment can be observed in each region in FIG. 19C. The c-axis direction between A and O is different from that between O and A', which indicates that a grain in the region between A and O is different from that between O and A'. In addition, between A and O, the angle of the c-axis continuously and gradually changes from 14.3°, 16.6°, to 30.9°. Similarly, between O and A', the angle of the c-axis continuously changes from −18.3°, −17.6°, to −11.3°.

Figure 20A:
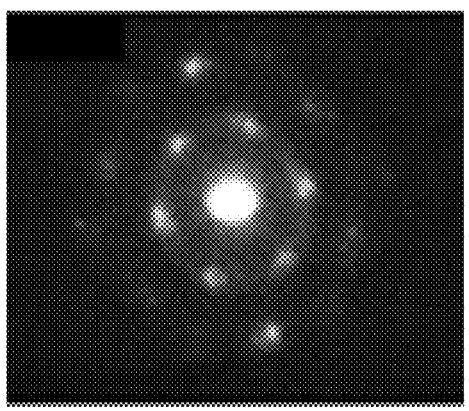
FIGS. 20A to 20D illustrate an example of a structure of an oxide semiconductor.

Note that in an electron diffraction pattern of the CAAC-OS film, spots (luminescent spots) having alignment are shown. For example, spots are observed in an electron diffraction pattern (also referred to as a nanobeam electron diffraction pattern) of the top surface of the CAAC-OS film which is obtained using an electron beam with a diameter of, for example, larger than or equal to 1 nm and smaller than or equal to 30 nm (see FIG. 20A).

From the results of the cross-sectional TEM image and the plan-view TEM image, alignment is found in the crystal parts in the CAAC-OS film.

Most of the crystal parts included in the CAAC-OS film each fit into a cube whose one side is less than 100 nm. Thus, there is a case where a crystal part included in the CAAC-OS film fits into a cube whose one side is less than 10 nm, less than 5 nm, or less than 3 nm. Note that when a plurality of crystal parts included in the CAAC-OS film are connected to each other, one large crystal region is formed in some cases. For example, a crystal region with an area of larger than or equal to 2500 nm$^2$, larger than or equal to 5 μm$^2$, or larger than or equal to 1000 μm$^2$ is observed in some cases in the plan-view TEM image.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray beam is incident on a sample in a direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single crystal oxide semiconductor film of InGaZnO$_4$, six peaks appear. The six peaks are derived from crystal planes equivalent to the (110)

plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are irregularly oriented between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface of the CAAC-OS film. Thus, for example, in the case where the shape of the CAAC-OS film is changed by etching or the like, the c-axis might not be necessarily parallel to a normal vector of a formation surface or a normal vector of a top surface of the CAAC-OS film.

In addition, distribution of c-axis aligned crystal parts in the CAAC-OS film is not necessarily uniform. For example, in the case where crystal growth leading to the crystal parts of the CAAC-OS film occurs from the vicinity of the top surface of the CAAC-OS film, the proportion of the c-axis aligned crystal parts in the vicinity of the top surface is higher than that in the vicinity of the formation surface in some cases. Furthermore, when an impurity is added to the CAAC-OS film, a region to which the impurity is added is altered, and the proportion of the c-axis aligned crystal parts in the CAAC-OS film varies depending on regions, in some cases.

Note that when the CAAC-OS film with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. A heavy metal such as iron or nickel, argon, carbon dioxide, or the like has a large atomic radius (or molecular radius), and thus disturbs the atomic arrangement of the oxide semiconductor film and decreases crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has small changes in electrical characteristics and high reliability. Electric charge captured by the carrier traps in the oxide semiconductor film takes a long time to be released, and might behave like fixed electric charge. Thus, the transistor that includes the oxide semiconductor film having high impurity concentration and a high density of defect states has unstable electrical characteristics in some cases.

In a transistor using the CAAC-OS film, changes in electrical characteristics due to irradiation with visible light or ultraviolet light are small.

[Microcrystalline Oxide Semiconductor Film]

Next, a microcrystalline oxide semiconductor film is described. In an image obtained with a TEM, crystal parts cannot be found clearly in the microcrystalline oxide semiconductor film in some cases. In most cases, the size of a crystal part included in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In an image of the nc-OS film obtained with a TEM, for example, a crystal grain boundary cannot be found clearly in some cases.

Figure 20B:
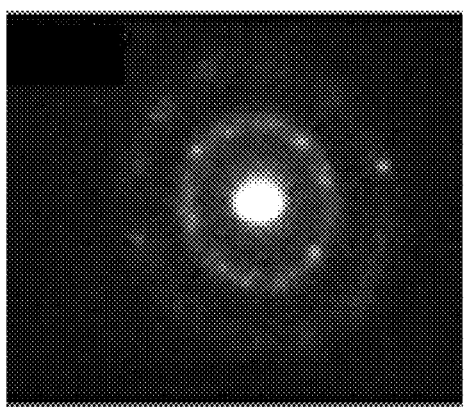

In the nc-OS film, a microscopic region (e.g., a region with a size greater than or equal to 1 nm and less than or equal to 10 nm, in particular, a region with a size greater than or equal to 1 nm and less than or equal to 3 nm) has a periodic atomic order. The nc-OS film does not have regularity of crystal orientation between different crystal parts. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than the diameter of a crystal part, a peak that shows a crystal plane does not appear. Furthermore, a halo pattern is shown in an electron diffraction pattern (also referred to as a selected-area electron diffraction pattern) of the nc-OS film obtained by using an electron beam having a probe diameter (e.g., larger than or equal to 50 nm) larger than the diameter of a crystal part. Meanwhile, spots are shown in a nanobeam electron diffraction pattern of the nc-OS film obtained by using an electron beam having a probe diameter close to, or smaller than the diameter of a crystal part. Furthermore, in a nanobeam electron diffraction pattern of the nc-OS film, regions with high luminance in a circular (ring) pattern are shown in some cases. Also in a nanobeam electron diffraction pattern of the nc-OS film, a plurality of spots are shown in a ring-like region in some cases (see FIG. 20B).

Since the nc-OS film is an oxide semiconductor film having more regularity than the amorphous oxide semiconductor film, the nc-OS film has a lower density of defect states than the amorphous oxide semiconductor film. However, there is no regularity of crystal orientation between different crystal parts in the nc-OS film; hence, the nc-OS film has a higher density of defect states than the CAAC-OS film.

Note that an oxide semiconductor film may be a stacked film including two or more films of an amorphous oxide semiconductor film, a microcrystalline oxide semiconductor film, and a CAAC-OS film, for example.

In the case where the oxide semiconductor film has a plurality of structures, the structures can be analyzed using nanobeam electron diffraction in some cases.

However, even when the oxide semiconductor film is a CAAC-OS film, a diffraction pattern that is partly similar to that of an nc-OS film is observed in some cases. Therefore, whether or not a CAAC-OS film is favorable can be determined by the proportion of a region where a diffraction pattern of a CAAC-OS film is observed in a predetermined area (also referred to as proportion of CAAC). In the case of a high quality CAAC-OS film, for example, the proportion of CAAC is higher than or equal to 50%, preferably higher than or equal to 80%, further preferably higher than or equal to 90%, still further preferably higher than or equal to 95%. Note that a proportion of a region where a diffraction pattern different from that of a CAAC-OS film is observed is referred to as the proportion of non-CAAC.

For example, transmission electron diffraction patterns were obtained by scanning a top surface of a sample including a CAAC-OS film obtained just after deposition (represented as "as-sputtered") and a top surface of a sample including a CAAC-OS film subjected to heat treatment at 450° C. in an atmosphere containing oxygen. Here, the proportion of CAAC was obtained in such a manner that diffraction patterns were observed by scanning for 60 seconds at a rate of 5 nm/second and the obtained diffraction patterns were converted into still images every 0.5 seconds. Note that as an electron beam, a nanobeam with a probe diameter of 1 nm was used. The above measurement was performed on six samples. The proportion of CAAC was calculated using the average value of the six samples.

The proportion of CAAC of the CAAC-OS film obtained just after the deposition was 75.7% (the proportion of non-CAAC was 24.3%). The proportion of CAAC of the CAAC-OS film subjected to the heat treatment at 450° C. was 85.3% (the proportion of non-CAAC was 14.7%). These results show that the proportion of CAAC obtained after the heat treatment at 450° C. is higher than that obtained just after the deposition. That is, heat treatment at a high temperature (e.g., higher than or equal to 400° C.) reduces the proportion of non-CAAC (increases the proportion of CAAC). Further, the above results also indicate that even when the temperature of the heat treatment is lower than 500° C., the CAAC-OS film can have a high proportion of CAAC.

Here, most of diffraction patterns different from that of a CAAC-OS film are diffraction patterns similar to that of an nc-OS film. Furthermore, an amorphous oxide semiconductor film was not able to be observed in the measurement region. Therefore, the above results suggest that the region having a structure similar to that of an nc-OS film is rearranged by the heat treatment owing to the influence of the structure of the adjacent region, whereby the region becomes CAAC.

Figure 20C:
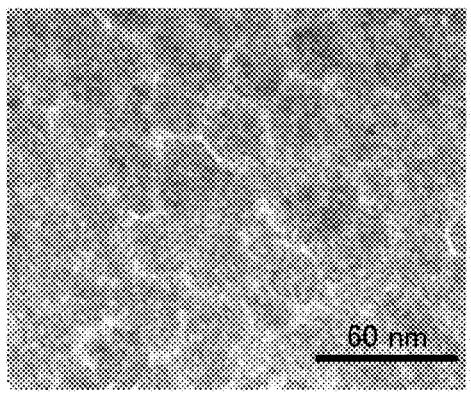
Figure 20D:
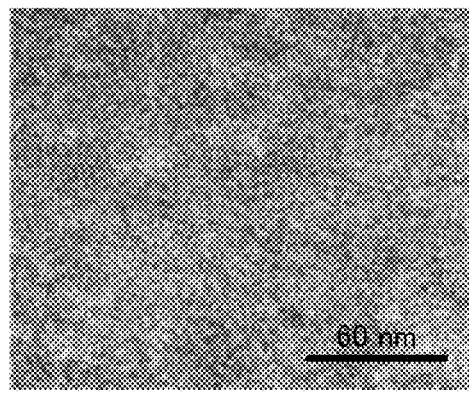

FIGS. 20C and 20D are plan-view TEM images of the CAAC-OS film obtained just after the deposition (as-sputtered) and the CAAC-OS film subjected to the heat treatment at 450° C., respectively. Comparison between FIGS. 20C and 20D shows that the CAAC-OS film subjected to the heat treatment at 450° C. has more uniform film quality. That is, the heat treatment at a high temperature improves the film quality of the CAAC-OS film.

With such a measurement method, the structure of an oxide semiconductor film having a plurality of structures can be analyzed in some cases.

(Embodiment 6)

In this embodiment, an example of a semiconductor device having a structure different from that in FIG. 14 will be described.

Figure 17:
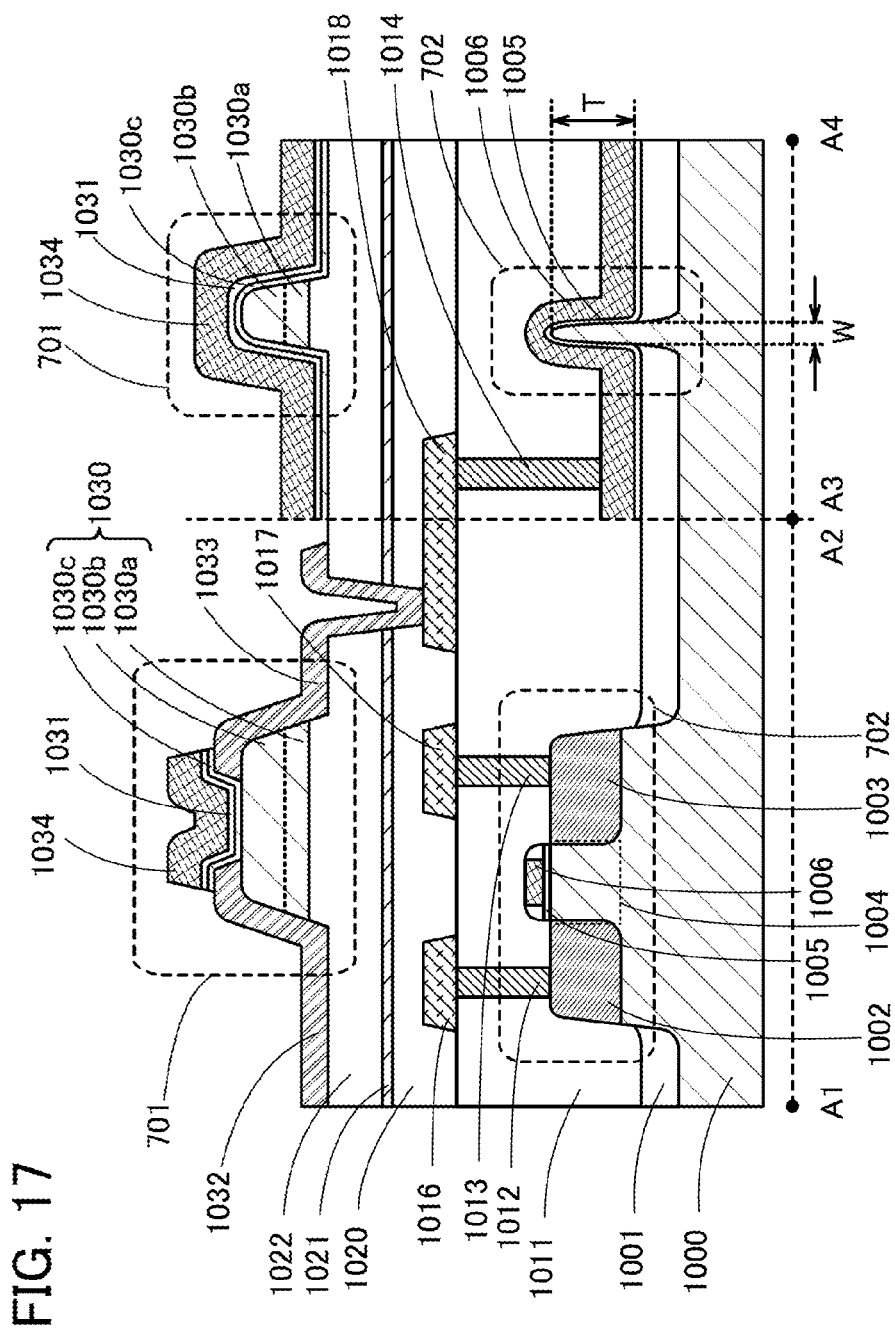
FIG. 17 illustrates an example of a structure of a semiconductor device.

FIG. 17 illustrates an example of a cross-sectional structure of a semiconductor device. A region along dashed line A1-A2 shows a structure of the transistors 702 and 701 in the channel length direction, and a region along dashed line A3-A4 shows a structure of the transistors 702 and 701 in the channel width direction. Note that in one embodiment of the present invention, the channel length direction of the transistor 702 is not necessarily the same as that of the transistor 701.

The channel length direction refers to a direction in which a carrier moves between a source (source electrode or source region) and a drain (drain electrode or drain region) by the most direct way, and the channel width direction refers to a direction perpendicular to the channel length direction in a plane parallel to a substrate.

In the example illustrated in FIG. 17, the transistor 701 including a channel formation region in an oxide semiconductor film is formed over the transistor 702 which is a Si transistor. Note that such a structure in which a Si transistor and an OS transistor are stacked can be appropriately used for the cells 11 and 12. For example, any of the transistors 102, 104, 202, and 204 in FIG. 2 to FIG. 5, FIGS. 13A and 13B, and the like can be formed over a single crystal silicon substrate like the transistor 702 in FIG. 17, and any of the transistors 101 and 201 in FIG. 2 to FIG. 5, FIGS. 13A and 13B, and the like can be provided as OS transistors over the transistor formed over the single crystal silicon substrate, like the transistor 701 in FIG. 17.

The transistor 702 may include the channel formation region in a semiconductor film or a semiconductor substrate of silicon, germanium, or the like in an amorphous, microcrystalline, polycrystalline, or single crystal state. Alternatively, the transistor 702 may include the channel formation region in an oxide semiconductor film or an oxide semiconductor substrate. In the case where the transistors each include a channel formation region in an oxide semiconductor film or an oxide semiconductor substrate, the transistor 701 is not necessarily stacked over the transistor 702, and the transistors 701 and 702 may be formed in the same layer.

In the case where the transistor 702 is formed using a thin silicon film, any of the following can be used in the thin film: amorphous silicon formed by a sputtering method or a vapor phase growth method such as a plasma CVD method; polycrystalline silicon obtained by crystallization of amorphous silicon by treatment such as laser irradiation; single crystal silicon obtained by separation of a surface portion of a single crystal silicon wafer by implantation of hydrogen ions or the like into the silicon wafer; and the like.

A substrate 1000 where the transistor 702 is formed can be, for example, a silicon substrate, a germanium substrate, or a silicon germanium substrate. In FIG. 17, a single crystal silicon substrate is used as the substrate 1000.

The transistor 702 is electrically isolated by an element isolation method. As the element isolation method, a trench isolation method or the like can be used. FIG. 17 illustrates an example where the trench isolation method is used to electrically isolate the transistor 702. Specifically, in FIG. 17, an element isolation region 1001 is formed in such a manner that an insulator including silicon oxide or the like is buried in a trench formed in the substrate 1000 by etching or the like and then the insulator is removed partly by etching or the like, so that the transistor 702 is electrically isolated by element isolation.

In a projection of the substrate 1000 that exists in a region other than the trench, an impurity region 1002 and an impurity region 1003 of the transistor 702 and a channel formation region 1004 placed between the impurity regions 1002 and 1003 are provided. Furthermore, the transistor 702 includes an insulating film 1005 covering the channel formation region 1004 and a gate electrode 1006 that overlaps with the channel formation region 1004 with the insulating film 1005 provided therebetween.

In the transistor 702, a side portion and an upper portion of the projection in the channel formation region 1004 overlap with the gate electrode 1006 with the insulating film 1005 positioned therebetween, so that carriers flow in a wide area including the side portion and the upper portion of the channel formation region 1004. Therefore, an area over the substrate occupied by the transistor 702 can be reduced, and the number of transferred carriers in the transistor 702 can be increased. As a result, the on-state current and field-effect mobility of the transistor 702 are increased. Suppose the length in the channel width direction (channel width) of the projection in the channel formation region 1004 is W, and the thickness of the projection in the channel formation region 1004 is T. As the aspect ratio of the thickness T to the channel width W increases, a region where carriers flow becomes larger. Thus, the on-state current of the transistor 702 can be further increased and the field-effect mobility of the transistor 702 can be further increased.

Note that when the transistor 702 is formed using a bulk semiconductor substrate, the aspect ratio is preferably 0.5 or more, further preferably 1 or more.

An insulating film 1011 is provided over the transistor 702. Opening portions are formed in the insulating film 1011. Conductive films 1012 and 1013 that are electrically connected to the impurity regions 1002 and 1003, respectively, and a conductive film 1014 that is electrically connected to the gate electrode 1006 are formed in the opening portions.

The conductive film 1012 is electrically connected to a conductive film 1016 formed over the insulating film 1011. The conductive film 1013 is electrically connected to a conductive film 1017 formed over the insulating film 1011. The conductive film 1014 is electrically connected to a conductive film 1018 formed over the insulating film 1011.

An insulating film 1020 is provided over the conductive films 1016 to 1018. An insulating film 1021 having a blocking effect of preventing diffusion of oxygen, hydrogen, and water is provided over the insulating film 1020. As the insulating film 1021 has higher density and becomes denser or has a fewer dangling bonds and becomes more chemically stable, the insulating film 1021 has a higher blocking effect. The insulating film 1021 that has the effect of blocking diffusion of oxygen, hydrogen, and water can be formed using, for example, aluminum oxide, aluminum oxynitride, gallium oxide, gallium oxynitride, yttrium oxide, yttrium oxynitride, hafnium oxide, or hafnium oxynitride. The insulating film 1021 having an effect of blocking diffusion of hydrogen and water can be formed using, for example, silicon nitride or silicon nitride oxide.

An insulating film 1022 is provided over the insulating film 1021, and the transistor 701 is provided over the insulating film 1022.

The transistor 701 includes, over the insulating film 1022, a semiconductor film 1030 including an oxide semiconductor, conductive films 1032 and 1033 functioning as source and drain electrodes and electrically connected to the semiconductor film 1030, a gate insulating film 1031 covering the semiconductor film 1030, and a gate electrode 1034 overlapping with the semiconductor film 1030 with the gate insulating film 1031 positioned therebetween. Note that an opening portion is formed in the insulating films 1020 to 1022. The conductive film 1033 is connected to the conductive film 1018 in the opening portion.

Note that in FIG. 17, the transistor 701 includes at least the gate electrode 1034 on one side of the semiconductor film 1030, and may further include a gate electrode overlapping with the semiconductor film 1030 with the insulating film 1022 positioned therebetween.

In the case where the transistor 701 has a pair of gate electrodes, one of the gate electrodes may be supplied with a signal for controlling the on/off state, and the other of the gate electrodes may be supplied with a potential from another element. In this case, potentials with the same level may be supplied to the pair of gate electrodes, or a fixed potential such as the ground potential may be supplied only to the other of the gate electrodes. By controlling the level of a potential supplied to the other of the gate electrodes, the threshold voltage of the transistor can be controlled.

In FIG. 17, the transistor 701 has a single-gate structure where one channel formation region corresponding to one gate electrode 1034 is provided. However, the transistor 701 may have a multi-gate structure where a plurality of electrically connected gate electrodes are provided so that a plurality of channel formation regions are included in one active layer.

FIG. 17 illustrates an example in which the semiconductor film 1030 included in the transistor 701 includes oxide semiconductor films 1030a to 1030c that are stacked in this order over the insulating film 1022. Note that in one embodiment of the present invention, the semiconductor film 1030 of the transistor 701 may be formed using a single-layer metal oxide film.

This embodiment can be implemented in appropriate combination with any of the other embodiments.

(Embodiment 7)

The variety of films disclosed in the other embodiments, such as the conductive films, the semiconductor films, and the insulating films can be formed by a sputtering method or a plasma CVD method; however, such films may be formed by another method, e.g., a thermal CVD (chemical vapor deposition) method. A metal organic chemical vapor deposition (MOCVD) method or an atomic layer deposition (ALD) method may be employed as an example of a thermal CVD method.

A thermal CVD method has an advantage that no defect due to plasma damage is generated since it does not utilize plasma for forming a film.

Deposition by a thermal CVD method may be performed in such a manner that a source gas and an oxidizer are supplied to the chamber at a time, the pressure in the chamber is set to an atmospheric pressure or a reduced pressure, and reaction is caused in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, an inert gas (e.g., argon or nitrogen) or the like is introduced when or after a first source gas is introduced so that the source gases are not mixed, and then a second source gas is introduced. Note that in the case where the inert gas is introduced at the same time as the first source gas, the inert gas serves as a carrier gas, and the inert gas may also be introduced at the same time as the second source gas. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET.

The variety of films such as the conductive film, the semiconductor film, and the insulating film which have been disclosed in the embodiments can be formed by a thermal CVD method such as a MOCVD method or an ALD method. For example, in the case where an In—Ga—Zn—O film is formed, trimethylindium, trimethylgallium, and dimethylzinc can be used. Note that the chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium and diethylzinc (chemical formula: $Zn(C_2H_5)_2$) can be used instead of dimethylzinc.

For example, in the case where a hafnium oxide film is formed with a deposition apparatus employing ALD, two kinds of gases, i.e., ozone ($O_3$) as an oxidizer and a source material gas which is obtained by vaporizing liquid containing a solvent and a hafnium precursor compound (hafnium alkoxide or hafnium amide such as tetrakis(dimethylamide)hafnium (TDMAH)) are used. Note that the chemical formula of tetrakis(dimethylamide)hafnium is $Hf[N(CH_3)_2]_4$. Examples of another material liquid include tetrakis(ethylmethylamide)hafnium.

For example, in the case where an aluminum oxide film is formed using a deposition apparatus employing ALD, two kinds of gases, e.g., $H_2O$ as an oxidizer and a source gas which is obtained by vaporizing liquid containing a solvent and an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

For example, in the case where a silicon oxide film is formed with a deposition apparatus employing ALD, hexachlorodisilane is adsorbed on a surface where a film is to be formed, chlorine contained in the adsorbate is removed, and radicals of an oxidizing gas (e.g., $O_2$ or dinitrogen monoxide) are supplied to react with the adsorbate.

For example, in the case where a tungsten film is formed using a deposition apparatus employing ALD, a $WF_6$ gas and a $B_2H_6$ gas are sequentially introduced plural times to form an initial tungsten film, and then a $WF_6$ gas and an $H_2$ gas are introduced at a time, so that a tungsten film is formed. Note that an $SiH_4$ gas may be used instead of a $B_2H_6$ gas.

For example, in the case where an oxide semiconductor film, e.g., an In—Ga—Zn—O film is formed using a deposition apparatus employing ALD, an $In(CH_3)_3$ gas and an $O_3$ gas are sequentially introduced plural times to form an In—O layer, a $Ga(CH_3)_3$ gas and an $O_3$ gas are introduced at a time to form a Ga—O layer, and then a $Zn(CH_3)_2$ gas and an $O_3$ gas are introduced at a time to form a Zn—O layer. Note that the order of these layers is not limited to this example. A mixed compound layer such as an In—Ga—O layer, an In—Zn—O layer, or a Ga—Zn—O layer may be formed by mixing of these gases. Note that although an $H_2O$ gas which is obtained by bubbling with an inert gas such as Ar may be used instead of an $O_3$ gas, it is preferable to use an $O_3$ gas, which does not contain H. Instead of an $In(CH_3)_3$ gas, an $In(C_2H_5)_3$ gas may be used. Instead of a $Ga(CH_3)_3$ gas, a $Ga(C_2H_5)_3$ gas may be used. Furthermore, a $Zn(CH_3)_2$ gas may be used.

This embodiment can be implemented in appropriate combination with any of the other embodiments.

(Embodiment 8)

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are cellular phones, game machines including portable game machines, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and medical devices. FIGS. 18A to 18F illustrate specific examples of these electronic devices.

FIG. 18A illustrates a portable game machine, which includes a housing 5001, a housing 5002, a display portion 5003, a display portion 5004, a microphone 5005, a speaker 5006, an operation key 5007, a stylus 5008, and the like. The semiconductor device of one embodiment of the present invention can be used for a variety of integrated circuits included in portable game machines. Although the portable game machine in FIG. 18A has the two display portions 5003 and 5004, the number of display portions included in a portable game machine is not limited to this.

FIG. 18B illustrates a portable information terminal including a first housing 5601, a second housing 5602, a first display portion 5603, a second display portion 5604, a joint 5605, an operation key 5606, and the like. The semiconductor device of one embodiment of the present invention can be used for a variety of integrated circuits included in portable information terminals. The first display portion 5603 is provided in the first housing 5601, and the second display portion 5604 is provided in the second housing 5602. The first housing 5601 and the second housing 5602 are connected to each other with the joint 5605, and the angle between the first housing 5601 and the second housing 5602 can be changed with the joint 5605. Images displayed on the first display portion 5603 may be switched in accordance with the angle at the joint 5605 between the first housing 5601 and the second housing 5602. A display device with a position input function may be used as at least one of the first display portion 5603 and the second display portion 5604. Note that the position input function can be added by providing a touch panel in a display device. Alternatively, the position input function can be added by provision of a photoelectric conversion element called a photosensor in a pixel portion of a display device.

FIG. 18C illustrates a notebook type personal computer including a housing 5401, a display portion 5402, a keyboard 5403, a pointing device 5404, and the like. The semiconductor device of one embodiment of the present invention can be used for a variety of integrated circuits included in notebook type personal computers.

FIG. 18D illustrates an electric refrigerator-freezer including a housing 5301, a refrigerator door 5302, a freezer door 5303, and the like. The semiconductor device of one embodiment of the present invention can be used for a variety of integrated circuits included in electric refrigerator-freezers.

FIG. 18E illustrates a video camera including a first housing 5801, a second housing 5802, a display portion 5803, operation keys 5804, a lens 5805, a joint 5806, and the like. The semiconductor device of one embodiment of the present invention can be used for a variety of integrated circuits included in video cameras. The operation keys 5804 and the lens 5805 are provided in the first housing 5801, and the display portion 5803 is provided in the second housing 5802. The first housing 5801 and the second housing 5802 are connected to each other with the joint 5806, and the angle between the first housing 5801 and the second housing 5802 can be changed with the joint 5806. Images displayed on the display portion 5803 may be switched in accordance with the angle at the joint 5806 between the first housing 5801 and the second housing 5802.

FIG. 18F illustrates a passenger car including a car body 5101, wheels 5102, a dashboard 5103, lights 5104, and the like. The semiconductor device of one embodiment of the present invention can be used for a variety of integrated circuits included in passenger cars.

(Description of the Specification and the Like)

Description of this specification and the like will be described below.

Note that in this specification and the like, an explicit description "X and Y are connected" means that X and Y are electrically connected, X and Y are functionally connected, and X and Y are directly connected. Accordingly, without being limited to a predetermined connection relation, for example, a connection relation shown in drawings or text, another connection relation is included in the drawings or the text.

Here, X and Y each denote an object (e.g., a device, an element, a circuit, a wiring, an electrode, a terminal, a conductive film, or a layer).

For example, in the case where X and Y are electrically connected, one or more elements that enable an electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, the switch is conducting or not conducting (is turned on or off) to determine whether current flows therethrough or not. Alternatively, the switch has a function of selecting and changing a current path.

For example, in the case where X and Y are functionally connected, one or more circuits that enable functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, and a buffer circuit; a signal generation circuit; a memory circuit; or a control circuit) can be connected between X and Y. For example, even when another circuit is interposed between X and Y, X and Y are functionally connected if a signal output from X is transmitted to Y.

Note that an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, the explicit expression "X and Y are electrically connected" is the same as the explicit simple expression "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X the source (or the first terminal or the like) of the transistor, the drain (or the second terminal or the like) of the transistor, and Y are provided to be connected in this order". When the connection order in a circuit structure is defined by an expression similar to the above examples, a source (or a first terminal or the like) and a drain (or a second terminal or the like) of a transistor can be distinguished from each other to specify the technical scope. Note that one embodiment of the present invention is not limited to these expressions which are just examples. Here, each of X, Y, Z1, and Z2 denotes an object (e.g., a device, an element, a circuit, a wiring, an electrode, a terminal, a conductive film, a layer, or the like).

A source of a transistor means a source region that is part of a semiconductor film functioning as an active layer or a source electrode electrically connected to the semiconductor film. Similarly, a drain of a transistor means a drain region that is part of a semiconductor film or a drain electrode electrically connected to the semiconductor film. A gate means a gate electrode.

The terms "source" and "drain" of a transistor interchange with each other depending on the conductivity type of the transistor or the levels of potentials applied to the terminals. In general, in an n-channel transistor, a terminal to which a lower potential is applied is referred to as a source, and a terminal to which a higher potential is applied is referred to as a drain. Furthermore, in a p-channel transistor, a terminal to which a lower potential is applied is referred to as a drain, and a terminal to which a higher potential is applied is referred to as a source. In this specification, the connection relation of the transistor is sometimes described assuming that the source and the drain are fixed for convenience; actually, the names of the source and the drain interchange with each other depending on the relation of the potentials.

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Note that a content (or may be part of the content) described in one embodiment may be applied to, combined with, or replaced by a different content (or may be part of the different content) described in the embodiment and/or a content (or may be part of the content) described in one or a plurality of different embodiments.

Note that in each embodiment, a content described in the embodiment is a content described with reference to a variety of diagrams or a content described with a text described in the specification.

Note that by combining a diagram (or may be part of the diagram) illustrated in one embodiment with another part of the diagram, a different diagram (or may be part of the different diagram) illustrated in the embodiment, and/or a diagram (or may be part of the diagram) illustrated in one or a plurality of different embodiments, much more diagrams can be formed.

One embodiment of the invention excluding a content which is not specified in the diagrams and texts in the specification can be constituted. Alternatively, when the range of a value that is defined by the maximum and minimum values is described, the range is appropriately narrowed or part of the range is removed, whereby one embodiment of the invention excluding part of the range can be constituted. In this manner, it is possible to specify the technical scope of one embodiment of the present invention so that a conventional technology is excluded, for example.

As a specific example, a diagram of a circuit including a first transistor to a fifth transistor is illustrated. In that case, it can be specified that the circuit does not include a sixth transistor in the invention. It can be specified that the circuit does not include a capacitor in the invention. It can be specified that the circuit does not include a sixth transistor with a particular connection structure in the invention. It can be specified that the circuit does not include a capacitor with a particular connection structure in the invention. For example, it can be specified that a sixth transistor whose gate is connected to a gate of the third transistor is not included in the invention. For example, it can be specified that a capacitor whose first electrode is connected to the gate of the third transistor is not included in the invention.

As another specific example, a description of a value, "a voltage is preferably higher than or equal to 3 V and lower than or equal to 10 V" is given. In that case, for example, it can be specified that the case where the voltage is higher than or equal to −2 V and lower than or equal to 1 V is excluded from one embodiment of the invention. For example, it can be specified that the case where the voltage is higher than or equal to 13 V is excluded from one embodiment of the invention. Note that, for example, it can be specified that the voltage is higher than or equal to 5 V and lower than or equal to 8 V in the invention. For example, it can be specified that the voltage is approximately 9 V in the invention. For example, it can be specified that the voltage is higher than or equal to 3 V and lower than or equal to 10 V but is not 9 V in the invention. Note that even when the description "a value is preferably in a certain range" or "a value preferably satisfies a certain condition" is given, the value is not limited to the description. In other words, a description of a value that includes a term "preferable", "preferably", or the like does not necessarily limit the value.

As another specific example, a description of a value, "a voltage is preferred to be 10 V" is given. In that case, for example, it can be specified that the case where the voltage is higher than or equal to −2 V and lower than or equal to 1 V is excluded from one embodiment of the invention. For example, it can be specified that the case where the voltage is higher than or equal to 13 V is excluded from one embodiment of the invention.

As another specific example, the description "a film is an insulating film" is given to describe a property of a material. In that case, for example, it can be specified that the case where the insulating film is an organic insulating film is excluded from one embodiment of the invention. For example, it can be specified that the case where the insulating film is an inorganic insulating film is excluded from one embodiment of the invention. For example, it can be specified that the case where the insulating film is a conductive film is excluded from one embodiment of the invention. For example, it can be specified that the case where the insulating film is a semiconductor film is excluded from one embodiment of the invention.

As another specific example, the description of a stacked structure, "a film is provided between an A film and a B film" is given. In that case, for example, it can be specified that the case where the film is a layered film of four or more layers is excluded from the invention. For example, it can be specified that the case where a conductive film is provided between the A film and the film is excluded from the invention.

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, one embodiment of the invention can be clear even when connection portions are not specified. Further, in the case where a connection portion is disclosed in this specification and the like, it can be determined that one embodiment of the invention in which a connection portion is not specified is disclosed in this specification and the like, in some cases. In particular, in the case where the number of portions to which the terminal is connected might be plural, it is not necessary to specify the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least the connection portion of a circuit is specified. Alternatively, it might be possible for those skilled in the art to specify the invention when at least a function of a circuit is specified. In other words, when a function of a circuit is specified, one embodiment of the invention can be clear. Furthermore, it can be determined that one embodiment of the invention whose function is specified is disclosed in this specification and the like. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

Note that in this specification and the like, in a diagram or a text described in one embodiment, it is possible to take out part of the diagram or the text and constitute an embodiment of the invention. Thus, in the case where a diagram or a text related to a certain portion is described, the context taken out from part of the diagram or the text is also disclosed as one embodiment of the invention, and one embodiment of the invention can be constituted. The embodiment of the invention is clear. Therefore, for example, in a diagram or a text in which one or more active elements (e.g., transistors or diodes), wirings, passive elements (e.g., capacitors or resistors), conductive layers, insulating layers, semiconductor layers, organic materials, inorganic materials, components, devices, operating methods, manufacturing methods, or the like are described, part of the diagram or the text is taken out, and one embodiment of the invention can be constituted. For example, from a circuit diagram in which N circuit elements (e.g., transistors or capacitors; N is an integer) are provided, it is possible to constitute one embodiment of the invention by taking out M circuit elements (e.g., transistors or capacitors; M is an integer, where M<N). As another example, it is possible to constitute one embodiment of the invention by taking out M layers (M is an integer, where M<N) from a cross-sectional view in which N layers (N is an integer) are provided. As another example, it is possible to constitute one embodiment of the invention by taking out M elements (M is an integer, where M<N) from a flow chart in which N elements (N is an integer) are provided. As another example, it is possible to take out some given elements from a sentence "A includes B, C, D, E, or F" and constitute one embodiment of the invention, for example, "A includes B and E", "A includes E and F", "A includes C, E, and F", or "A includes B, C, D, and E".

Note that in the case where at least one specific example is described in a diagram or a text described in one embodiment in this specification and the like, it will be readily appreciated by those skilled in the art that a broader concept of the specific example can be derived. Therefore, in the diagram or the text described in one embodiment, in the case where at least one specific example is described, a broader concept of the specific example is disclosed as one embodiment of the invention, and one embodiment of the invention can be constituted. The embodiment of the invention is clear.

Note that in this specification and the like, a content described in at least a diagram (which may be part of the diagram) is disclosed as one embodiment of the invention, and one embodiment of the invention can be constituted. Therefore, when a certain content is described in a diagram, the content is disclosed as one embodiment of the invention even when the content is not described with a text, and one embodiment of the invention can be constituted. In a similar manner, part of a diagram, which is taken out from the diagram, is disclosed as one embodiment of the invention, and one embodiment of the invention can be constituted. The embodiment of the invention is clear.

This application is based on Japanese Patent Application serial No. 2014-049605 filed with Japan Patent Office on Mar. 13, 2014, the entire contents of which are hereby incorporated by reference.

What is claimed is:

1. A semiconductor device comprising:
a cell array comprising:
   a first cell comprising a first transistor, a second transistor, and a first capacitor; and
   a second cell comprising a third transistor, a fourth transistor, and a second capacitor; and
a driver circuit;
wherein the driver circuit is electrically connected to the first cell and the second cell,
wherein a gate of the first transistor is electrically connected to a first wiring,
wherein one of a source and a drain of the first transistor is electrically connected to a second wiring,
wherein the other of the source and the drain of the first transistor is electrically connected to a gate of the second transistor and one electrode of the first capacitor,
wherein one of a source and a drain of the second transistor is electrically connected to the second wiring,
wherein the other of the source and the drain of the second transistor is electrically connected to a third wiring,
wherein the other electrode of the first capacitor is electrically connected to a fourth wiring,
wherein a gate of the third transistor is electrically connected to a fifth wiring,
wherein one of a source and a drain of the third transistor is electrically connected to a sixth wiring,
wherein the other of the source and the drain of the third transistor is electrically connected to a gate of the fourth transistor and one electrode of the second capacitor,
wherein one of a source and a drain of the fourth transistor is electrically connected to the sixth wiring,
wherein the other of the source and the drain of the fourth transistor is electrically connected to the third wiring,
wherein the other electrode of the second capacitor is electrically connected to a seventh wiring,
wherein each of the first transistor and the third transistor includes an oxide semiconductor in a channel formation region, and
wherein the sixth wiring has a function of transmitting a signal different from a signal supplied to the second wiring.

2. The semiconductor device according to claim 1, wherein the conductivity type of the second transistor is different from that of the fourth transistor.

3. The semiconductor device according to claim 1, wherein the fourth wiring has a function of transmitting a signal for controlling a potential of the gate of the second transistor, and wherein the seventh wiring has a function of transmitting a fixed potential.

4. The semiconductor device according to claim 1, further comprising:
a function of performing a first operation in which data read from the first cell is written to the second cell; and
a function of performing a second operation in which data read from the second cell is written to the first cell.

5. The semiconductor device according to claim 4,
wherein the first operation is performed by a first step of supplying a potential of the one electrode of the first capacitor to the third wiring through the first transistor, the second wiring, and the second transistor, and a second step of supplying a potential of the third wiring to the one electrode of the second capacitor through the fourth transistor, the sixth wiring, and the third transistor, and
wherein the second operation is performed by a third step of supplying a potential of the one electrode of the second capacitor to the third wiring through the third transistor, the sixth wiring, and the fourth transistor, and a fourth step of supplying the potential of the third wiring to the one electrode of the first capacitor through the second transistor, the second wiring, and the first transistor.

6. A semiconductor device comprising:
a cell array comprising:
a first cell comprising a first transistor, a second transistor, and a first capacitor; and
a second cell comprising a third transistor, a fourth transistor, and a second capacitor; and
a driver circuit;
wherein the driver circuit is electrically connected to the first cell and the second cell,
wherein a gate of the first transistor is electrically connected to a first wiring,
wherein one of a source and a drain of the first transistor is electrically connected to a second wiring,
wherein the other of the source and the drain of the first transistor is electrically connected to a gate of the second transistor and one electrode of the first capacitor,
wherein one of a source and a drain of the second transistor is electrically connected to the second wiring,
wherein the other of the source and the drain of the second transistor is electrically connected to a third wiring,
wherein the other electrode of the first capacitor is electrically connected to a fourth wiring,
wherein a gate of the third transistor is electrically connected to a fifth wiring,
wherein one of a source and a drain of the third transistor is electrically connected to a sixth wiring,
wherein the other of the source and the drain of the third transistor is electrically connected to a gate of the fourth transistor and one electrode of the second capacitor,
wherein one of a source and a drain of the fourth transistor is electrically connected to the sixth wiring,
wherein the other of the source and the drain of the fourth transistor is electrically connected to the third wiring,
wherein the other electrode of the second capacitor is electrically connected to a seventh wiring,
wherein each of the first transistor and the third transistor includes an oxide semiconductor in a channel formation region,
wherein the sixth wiring has a function of transmitting a signal different from a signal supplied to the second wiring,
wherein the conductivity type of the second transistor is different from that of the fourth transistor,
wherein the fourth wiring has a function of transmitting a signal for controlling a potential of the gate of the second transistor, and
wherein the seventh wiring has a function of transmitting a fixed potential.

7. The semiconductor device according to claim 6, further comprising:
a function of performing a first operation in which data read from the first cell is written to the second cell; and
a function of performing a second operation in which data read from the second cell is written to the first cell.

8. The semiconductor device according to claim 7,
wherein the first operation is performed by a first step of supplying a potential of the one electrode of the first capacitor to the third wiring through the first transistor, the second wiring, and the second transistor, and a second step of supplying a potential of the third wiring to the one electrode of the second capacitor through the fourth transistor, the sixth wiring, and the third transistor, and
wherein the second operation is performed by a third step of supplying a potential of the one electrode of the second capacitor to the third wiring through the third transistor, the sixth wiring, and the fourth transistor, and a fourth step of supplying the potential of the third wiring to the one electrode of the first capacitor through the second transistor, the second wiring, and the first transistor.

9. A semiconductor device comprising:
a cell array comprising:
a first cell comprising a first transistor, a second transistor, and a first capacitor; and
a second cell comprising a third transistor, a fourth transistor, and a second capacitor; and
a driver circuit;
a function of performing a first operation in which data read from the first cell is written to the second cell; and
a function of performing a second operation in which data read from the second cell is written to the first cell,
wherein the driver circuit is electrically connected to the first cell and the second cell,
wherein a gate of the first transistor is electrically connected to a first wiring,
wherein one of a source and a drain of the first transistor is electrically connected to a second wiring,
wherein the other of the source and the drain of the first transistor is electrically connected to a gate of the second transistor and one electrode of the first capacitor,
wherein one of a source and a drain of the second transistor is electrically connected to the second wiring,
wherein the other of the source and the drain of the second transistor is electrically connected to a third wiring,
wherein the other electrode of the first capacitor is electrically connected to a fourth wiring,
wherein a gate of the third transistor is electrically connected to a fifth wiring,
wherein one of a source and a drain of the third transistor is electrically connected to a sixth wiring, wherein the other of the source and the drain of the third transistor is electrically connected to a gate of the fourth transistor and one electrode of the second capacitor, wherein one of a source and a drain of the fourth transistor is electrically connected to the sixth wiring, wherein the other of the source and the drain of the fourth transistor is electrically connected to the third wiring, wherein the other electrode of the second capacitor is electrically connected to a seventh wiring, wherein each of the first transistor and the third transistor includes an oxide semiconductor in a channel formation region, wherein the sixth wiring has a function of transmitting a signal different from a signal supplied to the second wiring, wherein the fourth wiring has a function of transmitting a signal for controlling a potential of the gate of the second transistor, and wherein the seventh wiring has a function of transmitting a fixed potential.

10. The semiconductor device according to claim 9, wherein the first operation is performed by a first step of supplying a potential of the one electrode of the first capacitor to the third wiring through the first transistor, the second wiring, and the second transistor, and a second step of supplying a potential of the third wiring to the one electrode of the second capacitor through the fourth transistor, the sixth wiring, and the third transistor, and wherein the second operation is performed by a third step of supplying a potential of the one electrode of the second capacitor to the third wiring through the third transistor, the sixth wiring, and the fourth transistor, and a fourth step of supplying the potential of the third wiring to the one electrode of the first capacitor through the second transistor, the second wiring, and the first transistor.

* * * * *